(12) United States Patent
Hsu et al.

(10) Patent No.: US 11,532,576 B2
(45) Date of Patent: Dec. 20, 2022

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Sen-Kuei Hsu, Kaohsiung (TW); Hsin-Yu Pan, Taipei (TW); Yi-Che Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 28 days.

(21) Appl. No.: 16/787,020

(22) Filed: Feb. 11, 2020

(65) Prior Publication Data

US 2021/0249372 A1    Aug. 12, 2021

(51) Int. Cl.
| | |
|---|---|
| *H01L 21/66* | (2006.01) |
| *H01L 27/146* | (2006.01) |
| *H01L 23/00* | (2006.01) |
| *G01R 31/28* | (2006.01) |

(52) U.S. Cl.
CPC .......... *H01L 24/03* (2013.01); *G01R 31/2884* (2013.01); *G01R 31/2896* (2013.01); *H01L 24/06* (2013.01); *H01L 2924/14* (2013.01)

(58) Field of Classification Search
CPC ....... H01L 2924/3511; H01L 2924/181; H01L 21/568
See application file for complete search history.

(56) References Cited

U.S. PATENT DOCUMENTS

| | | | | |
|---|---|---|---|---|
| 5,459,340 | A | * | 10/1995 | Anderson ............. H01L 27/118 257/E27.11 |
| 9,000,584 | B2 | | 4/2015 | Lin et al. |
| 9,048,222 | B2 | | 6/2015 | Hung et al. |
| 9,048,233 | B2 | | 6/2015 | Wu et al. |
| 9,064,879 | B2 | | 6/2015 | Hung et al. |
| 9,111,949 | B2 | | 8/2015 | Yu et al. |
| 9,263,511 | B2 | | 2/2016 | Yu et al. |
| 9,281,254 | B2 | | 3/2016 | Yu et al. |
| 9,368,460 | B2 | | 6/2016 | Yu et al. |
| 9,372,206 | B2 | | 6/2016 | Wu et al. |

(Continued)

*Primary Examiner* — Bradley Smith
*Assistant Examiner* — David J Goodwin
(74) *Attorney, Agent, or Firm* — JCIPRNET

(57) ABSTRACT

A manufacturing method of a semiconductor package includes the following steps. Semiconductor chips are disposed on a carrier. The semiconductor chips are grouped in a plurality of package units. The semiconductor chips are encapsulated in an encapsulant to form a reconstructed wafer. A redistribution structure is formed on the encapsulant. The redistribution structure electrically connects the semiconductor chips within a same package unit of the plurality of package units. The individual package units are separated by cutting through the reconstructed wafer along scribe line regions. In the reconstructed wafer, the plurality of package units are arranged so as to balance the number of scribe line regions extending across opposite halves of the reconstructed wafer in a first direction with respect to the number of scribe line regions extending across opposite halves of the reconstructed wafer in a second direction perpendicular to the first direction.

20 Claims, 17 Drawing Sheets

(56) References Cited

U.S. PATENT DOCUMENTS

| | | |
|---|---|---|
| 9,496,189 B2 | 11/2016 | Yu et al. |
| 10,504,824 B1* | 12/2019 | Pan ........................ H01L 21/304 |
| 2015/0093858 A1* | 4/2015 | Hwang ................... H01L 24/94 |
| | | 438/113 |
| 2015/0125997 A1* | 5/2015 | Wang .................... H01L 21/561 |
| | | 438/114 |
| 2017/0084595 A1* | 3/2017 | Seddon ................. H01L 21/304 |
| 2020/0312765 A1* | 10/2020 | Kawasaki ......... H01L 27/11565 |

\* cited by examiner

SEMICONDUCTOR PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
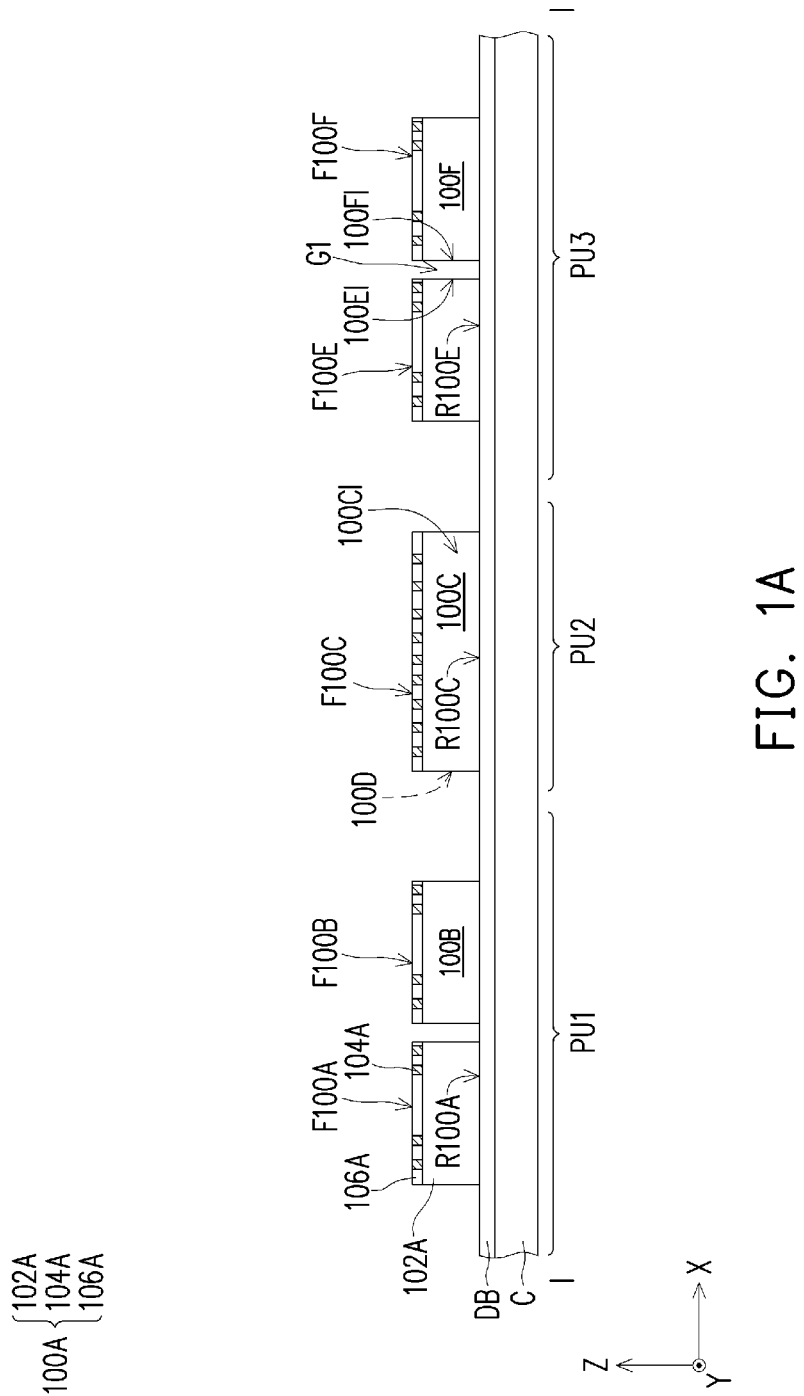
FIG. 1A to FIG. 1G are schematic cross-sectional views of structures produced at various stages of a manufacturing method of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1G are schematic cross-sectional views of structures produced at various stages of a manufacturing method of a semiconductor package 10 according to some embodiments of the present disclosure. The cross-sectional views of FIG. 1A to FIG. 1G are taken in a plane defined by the orthogonal directions X and Z, with a third orthogonal direction Y pointing towards the viewer. The three directions XYZ define a set of cartesian coordinates.

Referring to FIG. 1A, a carrier C is provided. In some embodiments, the carrier C is a glass substrate, a metal plate, a plastic supporting board, or the like, but other suitable substrate materials may be used as long as the materials are able to withstand the subsequent steps of the process. In some embodiments, a de-bonding layer DB is provided on the carrier C to facilitate peeling the carrier C away from the structure when required by the manufacturing process. In some embodiments, the de-bonding layer DB includes a light-to-heat conversion (LTHC) release layer.

In some embodiments, semiconductor chips 100A-100F are provided on the carrier C. In some embodiments, the semiconductor chips 100A-100F are placed onto the carrier C through a pick-and-place method. In the following, the labels A-F will be dropped when there is no need to differentiate between the several semiconductor chips 100A-100F. In such cases, the description shall generically refer to "semiconductor chips 100". The same applies for the components of the semiconductor chips 100 (e.g., the semiconductor substrates 102, the contact pads 104, and the protective layers 106).

In some embodiments, an individual semiconductor chip 100 includes a semiconductor substrate 102, contact pads 104, and a protective layer 106. The contact pads 104 are formed at the top surface 102t of the semiconductor substrate 102. The protective layer 106 covers the top surface 102t of the semiconductor substrate 102 left exposed by the contact pads 104. In some embodiments, the protective layer 106 may further extend on portions of the contact pads 104.

The semiconductor substrate 102 may be made of semiconductor materials, such as semiconductor materials of the groups III-V of the periodic table. In some embodiments, the semiconductor substrate 102 include elemental semiconductor materials, such as crystalline silicon, diamond, or germanium; compound semiconductor materials such as silicon carbide, gallium arsenide, indium arsenide, or indium phosphide, or alloy semiconductor materials such as silicon germanium, silicon germanium carbide, gallium arsenic phosphide, or gallium indium phosphide. In some embodiments, the material of the contact pads 104 includes aluminum, copper, copper alloys, or other conductive materials, and may be formed by deposition, plating, or other suitable techniques. The protective layer 106 may be a single layer or a multi-layered structure, and may include silicon oxide, silicon nitride, silicon oxy-nitride, other suitable dielectric materials, or combinations thereof. The protective layer 106 may be formed by suitable fabrication techniques such as spin-on coating, chemical vapor deposition (CVD), or the like.

In some embodiments, the protective layers 106 may cover the contact pads 104 and (temporarily) constitute the front surfaces F100 of the semiconductor chips 100. In some embodiments, the semiconductor chips 100 are placed over the carrier C with the front surfaces F100 facing away from the carrier C. Rear surfaces R100 opposite to the front surfaces F100 may be directed towards (and, possibly, in contact with) the de-bonding layer DB. In some embodiments, the semiconductor chips 100 are or include memory dies, and are configured as dynamic random-access memories (DRAMs), resistive random-access memories (RRAMs), static random-access memories (SRAMs), magnetoresistive random access memories (MRAMs), ferroelectric random-access memories (FRAMs), or the like.

In some embodiments, a plurality of semiconductor chips 100 is provided on the carrier C to produce multiple package units PU with wafer-level packaging technology. It should be noted that while only three package units PU1-PU3 are illustrated in FIG. 1A, more than three package units PU are usually produced at the wafer-level, and that the disclosure is not limited in this sense. Similar to what discussed above for the semiconductor chips 100, also for the package units PU the numerical labels (e.g., 1-3) may be dropped when the package units PU are not addressed individually. In such cases, the description may generically refer to package units PU. In some embodiments, the semiconductor chips 100 are disposed over the carrier C in pairs within the area corresponding to a package unit PU. For example, as illustrated in FIG. 1A, the package units PU1-PU3 may correspondingly include the pairs of semiconductor chips 100A with 100B, 100C with 100D, and 100E with 100F. In some embodiments, the semiconductor chips 100 have an elongated shape (e.g., a rectangular footprint). In some embodiments, the semiconductor chips 100 of a pair are disposed on the carrier C with larger side surfaces 100l directly facing each other aligned along a first direction and separated by a gap G1 along a second direction perpendicular to the first direction. For example, as illustrated for the package unit PU3, one of the larger side surfaces 100E1 of the semiconductor chip 100E faces one of the larger side surfaces 100F1 of the other semiconductor chip 100F of the pair. The longer edges of the larger side surfaces 100E1, 100F1 extend along the Y direction, and the two larger side surfaces 100E1, 100F1 are separated by the gap G1 along the X direction. In some embodiments, the semiconductor chips 100 are disposed on the carrier C so that the semiconductor chips 100 included in a package unit PU are oriented along a different direction than the semiconductor chips 100 included in an adjacent package unit PU. For example, the semiconductor chips 100A, 100B, 100E, 100F of the package units PU1 and PU3 are oriented with the longer edges of the corresponding footprints extending along the Y direction. The package unit PU2, which is disposed in between the package units PU1 and PU3, has the semiconductor chips 100C, 100D oriented with the longer edges of the corresponding footprints extending along the X direction. Indeed, the semiconductor chip 100D is not visible in the plane of view illustrated in FIG. 1A, as it may be located at a position corresponding to the semiconductor chip 100C but offset along the Y direction. Consequently, the gap G1 of the package unit PU2 may extend along the Y direction, rather than along the X direction as for the package units PU1 and PU3.

Figure 1B:
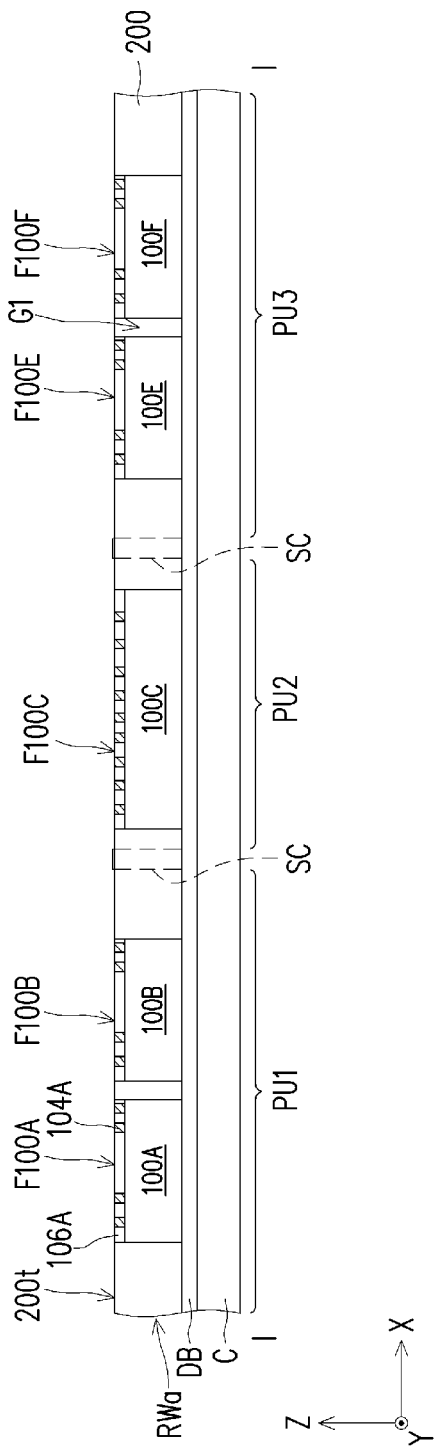

Referring to FIG. 1B, an encapsulant 200 is formed over the carrier C. In some embodiments, the encapsulant 200 laterally encapsulates the semiconductor chips 100. In some embodiments, the encapsulant 200 extends in the gaps G1 between the semiconductor chips of a given pair (e.g., the semiconductor chips 100A and 100B of the package unit PU1) as well as in the areas between the semiconductor chips of different package units (e.g., between the semiconductor chips 100C and 100D of the package unit PU2 and the semiconductor chip 100B of the package unit PU1). In some embodiments, the encapsulant 200 includes a molding compound, a molding underfill, a resin (such as an epoxy resin), or the like. In some embodiments, the encapsulant 200 is formed by an over-molding process. In some embodiments, the encapsulant 200 is formed by a compression molding process. In some embodiments, the encapsulant 200 may be initially formed so as to cover the front surfaces F100 of the semiconductor chips 100. Thereafter, a portion of the encapsulant 200 is removed, for example by a planarization process, until the contact pads 104 of the semiconductor chips 100 are exposed. In some embodiments, the planarization of the encapsulant 200 includes performing a mechanical grinding process and/or a chemical mechanical polishing (CMP) process. Following planarization, the front surfaces F100 of the semiconductor chips 100 may be defined by the corresponding protective layers 106 and contact pads 104. That is, following the planarization step, the contact pads 104 of the semiconductor chips 100 are exposed and available for electrically connecting the semiconductor chips 100 to subsequently formed components or elements. In some embodiments, the front surfaces F100 of the semiconductor chips 100 exposing the contact pads 104 are indicated as active surfaces. In some embodiments, the front surfaces F100 of the semiconductor chips 100 may be substantially coplanar with the top surface 200*t* of the encapsulant 200. In some embodiments, portions of the protective layers 106 may be removed during the planarization process to expose the corresponding contact pads 104. In some embodiments, with formation of the encapsulant 200 is obtained a reconstructed wafer RWa. In some embodiments, the reconstructed wafer RWa includes the plurality of package units PU. In other words, the exemplary process is performed at a reconstructed wafer level, so that multiple package units PU are processed in the form of the reconstructed wafer RWa. In some embodiments, adjacent package units PU are separated by scribe line regions SC which are filled by the encapsulant 200. That is, the scribe line regions SC may be located in between adjacent package units PU, and, at this stage of the manufacturing process, may contain only the encapsulant 200.

Figure 1C:
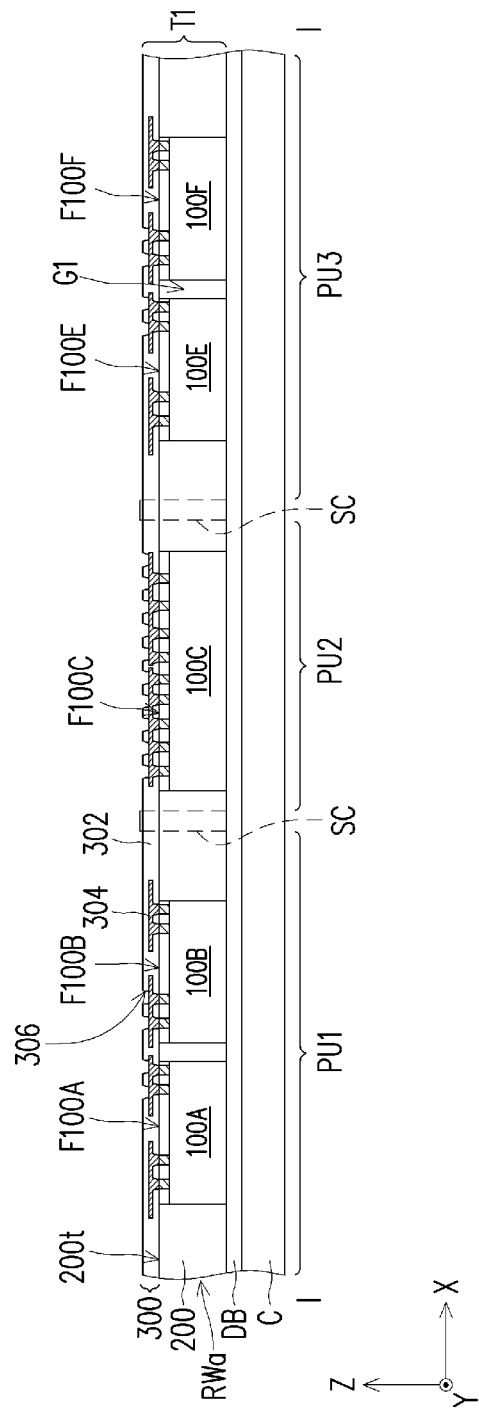

Referring to FIG. 1C, in some embodiments, a redistribution structure 300 is formed on the encapsulated semiconductor chips 100. In some embodiments, the redistribution structure 300 includes a dielectric layer 302 and a redistribution conductive layer 304. For simplicity, the dielectric layer 302 is illustrated as a single dielectric layer and the redistribution conductive layer 304 is illustrated as embedded in the dielectric layer 304. Nevertheless, from the perspective of the manufacturing process, the dielectric layer 302 is constituted by at least two dielectric layers. The redistribution conductive layer 304 may include multiple metallization tiers which may extend vertically through the dielectric layers 302 to establish electrical connection between different metallization tiers or with the semiconductor chips 100. Each metallization tier of the redistribution conductive layer 304 may be sandwiched between the two adjacent dielectric layers 302. In some embodiments, the (outermost) dielectric layer 302 is patterned to include openings 306 exposing the underlying redistribution conductive layer 304. In some embodiments, the openings 306 of the dielectric layer 302 are formed in the area in between the two semiconductor chips 100 of a package unit PU. That is, vertical projections of the openings 306 may fall on the semiconductor chips 100 and the encapsulant filling the gap G1 in between the semiconductor chips 100.

In some embodiments, the material of the dielectric layer 302 includes polyimide, epoxy resin, acrylic resin, phenol resin, benzocyclobutene (BCB), polybenzooxazole (PBO), or any other suitable polymer-based dielectric material. The dielectric layer 302, for example, may be formed by suitable fabrication techniques such as spin-on coating, chemical vapor deposition (CVD), plasma-enhanced chemical vapor deposition (PECVD), or the like. In some embodiments, the material of the redistribution conductive layer 304 includes aluminum, titanium, copper, nickel, tungsten, or alloys thereof. The redistribution conductive layer 304 may be formed by, for example, electroplating, deposition, and/or photolithography and etching. It should be noted that the number of metallization tiers of the redistribution conductive layer 304 and the number of the dielectric layers 302 illustrated in FIG. 1C are merely for illustrative purposes, and the disclosure is not limited thereto. In some alternative embodiments, fewer or more metallization tiers of the redistribution conductive layer 304 and fewer or more layers of the dielectric layer 302 may be formed depending on the circuit design. When more metallization tiers of the redistribution conductive layer 304 and more layers of the dielectric layer 302 are required, the metallization tiers of the redistribution conductive layer 304 are stacked alternately with the layers of the dielectric layer 302. In some embodiments, the semiconductor chips 100, the encapsulant 200 which laterally surrounds the semiconductor chips 100, and the redistribution structure 300 are considered a tier T1 of the package units PU. In some embodiments, the redistribution structure 300 interconnects the semiconductor chips 100 of a given package unit PU, but does not establish electrical connection between semiconductor chips 100 belonging to different package units PU. In some embodiments, the redistribution conductive layer 304 does not extend in the scribe line regions SC between adjacent package units PU.

Figure 1D:
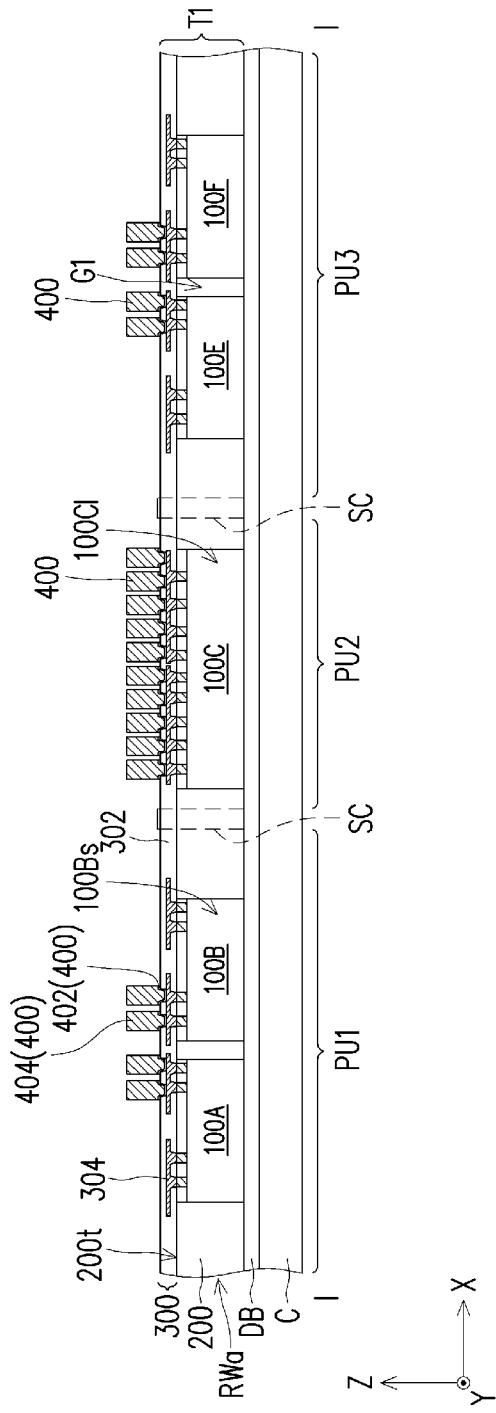

Referring to FIG. 1C and FIG. 1D, in some embodiments, through interconnect vias (TIVs) 400 are provided in the openings 306 of the redistribution structure 300. In some embodiments, the through interconnect vias 400 includes seed layers 402 and conductive pillars 404 stacked on the seed layers 402. The seed layers 402 extend within the openings 306 of the dielectric layer 302 to contact the exposed portions of the redistribution conductive layer 304. In some embodiments, the seed layers 402 include a titanium/copper composite. In some embodiments, the conductive pillars 404 vertically rise from the underlying seed layers 402. In some embodiments, the conductive pillars 404 include a metallic material (e.g., copper). In some embodiments, the TIVs 400 may be formed as described in the following. First, a seed material layer (not shown) is formed over the redistribution structure 300, for example by a sputtering process, to conformally cover the redistribution structure 300. An auxiliary mask (not shown) patterned with openings is formed on the seed material layer. The openings of the auxiliary mask are formed in correspondence of the openings 306 of the dielectric layer 302 and expose the intended locations for the subsequently formed TIVs 400. Afterwards, a plating process is performed to form a metallic material (e.g., a copper layer) on the portions of the seed material layer exposed by the openings of the auxiliary mask. Subsequently, the auxiliary mask and the seed material layer not covered by the metallic material are removed, for example via a stripping process and an etching process, to form the TIVs 400. However, the disclosure is not limited thereto. In some alternative embodiments, other suitable methods may be utilized to form the TIVs 400. For example, pre-fabricated TIVs 400 (e.g., pre-fabricated copper posts) may be picked-and-placed onto the redistribution structure 300 in correspondence of the openings 306. In some embodiments, vertical projections of the TIVs 400 fall on the semiconductor chips 100 as well as on the encapsulant 200 in the gap G1. In some embodiments, the TIVs 400 may be formed in an array manner within a package unit PU. For example, a package unit PU may include an array of (m×n) TIVs 400 extending across the two semiconductor chips 100 of the package unit PU. The arrays of TIVs 400 may be oriented as the semiconductor chips 100 of the corresponding package unit PU. For example, the arrays of TIVs 400 may be formed with the smaller dimension of the arrays oriented as the smaller side surfaces (e.g., the surface 100Bs) of the semiconductor chips 100, and the larger dimension of the arrays oriented as the larger side surfaces (e.g., the surface 100C1) of the semiconductor chips 100. For example, in FIG. 1D, each package includes an array of (10×4) TIVs. In the package unit PU1, ten rows of four TIVs 400 are extend along the X direction and are spaced along the Y direction, where only one row is visible in the plane of view of FIG. 1D. A similar disposition applies for the package unit PU3. On the other hand, in the package unit PU2, the ten rows of four TIVs 400 extend along the Y direction and are spaced along the X direction. As such, in the plane of view of FIG. 1D, a column of ten TIVs 400 is visible, while other columns are disposed offset along the Y direction. It should be noted that while in FIG. 1D arrays of (10×4) TIVs 400 are illustrated, the disclosure is not limited thereto. In some alternative embodiments, more or fewer TIVs 400 may be included in a package unit PU according to design and routing requirements. In some embodiments, the number of TIVs 400 may be determined based on the distance (the gap G1) between the semiconductor chips 100 of the tier T1. In some embodiments, the TIVs 400 may not be disposed in an array, depending on the circuit requirements.

Figure 1E:
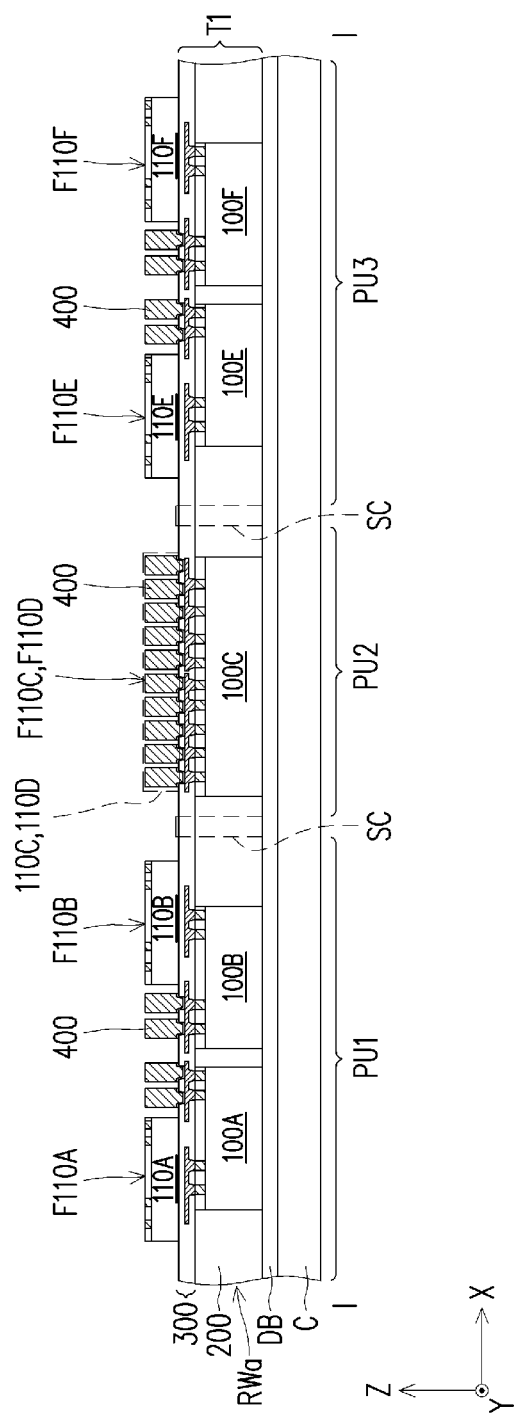

Referring to FIG. 1E, in some embodiments, semiconductor chips 110 (e.g., the semiconductor chips 110A-110F) are provided on the redistribution structure 300 beside the TIVs 400. The semiconductor chips 110 may be similar to the semiconductor chips 100, and a detailed description thereof is omitted herein. As for the semiconductor chips 100, the letter may be dropped from the label when the semiconductor chips 110 are referred to collectively. In some embodiments, the semiconductor chips 110 are placed onto the redistribution structure 300 through a pick-and-place method. The semiconductor chips 110 are disposed on the redistribution structure 300 with the corresponding front surfaces F110 facing away from the redistribution structure 300. In some embodiments, portions of die attach film (not shown) may secure the semiconductor chips 110 to the redistribution structure 300. In some embodiments, the semiconductor chips 110 are disposed on the redistribution structure 300 in pairs in correspondence of the semiconductor chips 100 of the tier T1. That is, in a given package unit PU, a first chip of a pair of semiconductor chips 110 may be vertically stacked with one semiconductor chip 100 of a pair in the tier T1, and a second chip of the same pair of semiconductor chips 110 may be vertically stacked with the other semiconductor chip 100 of the pair of the tier T1. That is, the semiconductor chips 110 at least partially overlap with corresponding underlying semiconductor chips 100. For example, in the package unit PU1, the semiconductor chip 110A may be disposed so as to at least partially overlap with the semiconductor chip 100A on one side of the array of TIVs 400, and the semiconductor chip 110B may be disposed so as to at least partially overlap with the semiconductor chip 100B on an opposite side of the array of the TIVs 400 along the X direction. A similar disposition applies for the semiconductor chips 110E and 110F with respect to the semiconductor chips 100E and 100F in the package unit PU3. In package unit PU2, the semiconductor chips 110C, 110D are also disposed partially overlapping with the semiconductor chips 100C and 100D, respectively. However, because the package unit PU2 is oriented along a different direction than the package units PU1 and PU3, the semiconductor chips 110C and 110D are disposed on opposite sides of the arrays of TIVs 400 along the Y direction, rather than the X direction. In the plane of view of FIG. 1E, neither of the semiconductor chips 110C and 110D is visible, and only the positions are indicated as outlines for illustration purposes.

Figure 1F:
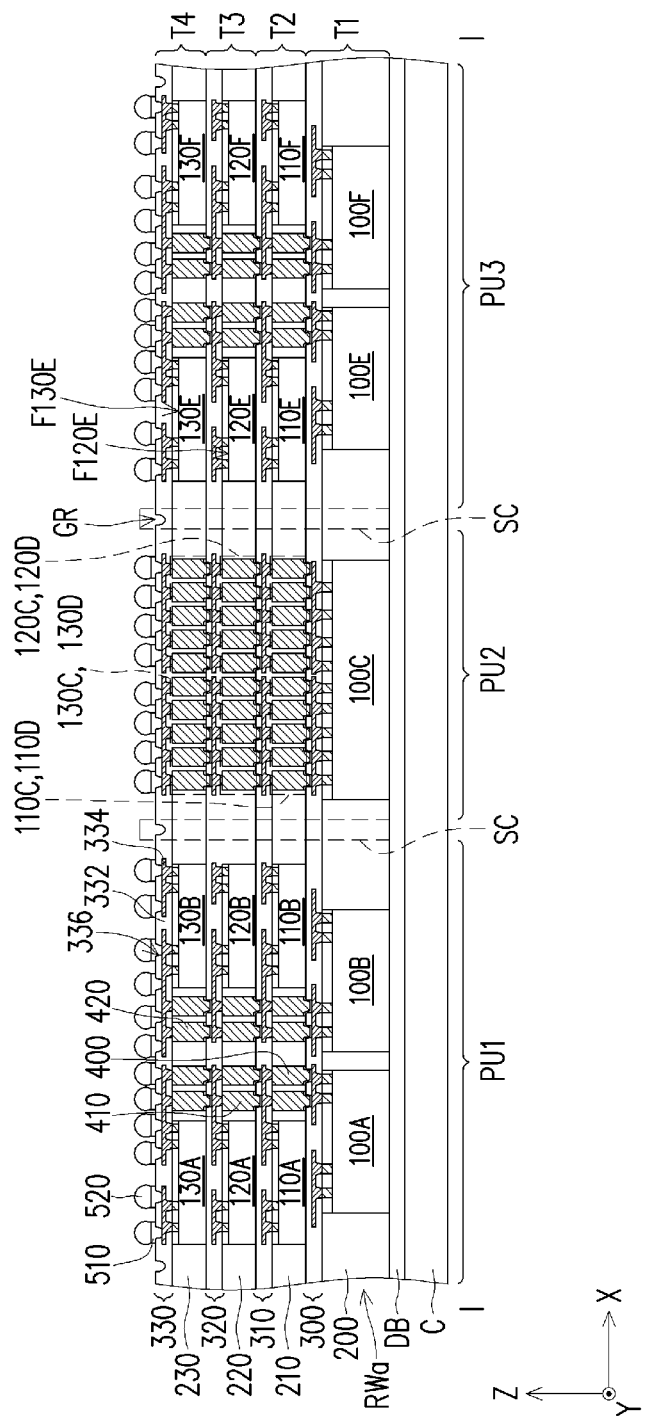

Referring to FIG. 1E and FIG. 1F, an encapsulant 210 may be produced on the redistribution structure 300 laterally wrapping the semiconductor chips 110 and the TIVs 400. The encapsulant 210 may extend in between adjacent TIVs 400 and in between the semiconductor chips 110 and the TIVs 400. A material and a manufacturing process of the encapsulant 210 may be selected from similar options as listed above for the encapsulant 200. Thereafter, a redistribution structure 310 may be formed on the encapsulant 200, the semiconductor chips 110 and the TIVs 400 in a similar manner as described above for the redistribution structure 300. The redistribution structure 310 may electrically connect the semiconductor chips 110 of a package unit PU with the TIVs 400 of the same package unit PU. Hence, the semiconductor chips 110 may be connected to the semiconductor chips 100 of the same package unit through the redistribution structures 300, 310 and the TIVs 400. In some embodiments, the TIVs 400, the semiconductor chips 110, the encapsulant 210 and the redistribution structure 310 may be considered as a tier T2 of the package units PU. As for the redistribution structure 300, also the redistribution structure 310 may not establish electrical connection between different package units PU.

Additional tiers (e.g., T3 and T4) may be provided on the tier T2 following similar process steps. That is, TIVs 410 may be formed on the redistribution structure 310 in an area overlying the TIVs 400. The TIVs 410 electrically contact the redistribution structure 310. Semiconductor chips 120 are disposed beside the TIVs 410, vertically stacked with the semiconductor chips 110 and partially overlapping with the semiconductor chips 100. The semiconductor chips 120 may be disposed with corresponding front surfaces F120 further away from the redistribution structure 310. Portions of die attach film (not shown) may secure the semiconductor chips 120 to the redistribution structure 310. An encapsulant 220 may encapsulate the TIVs 410 and the semiconductor chips 120. A redistribution structure 320 is formed on the encapsulant 220, the semiconductor chips 120 and the TIVs 410. The redistribution structure 320 electrically connects the semiconductor chips 120 of a given package unit PU. The TIVs 410 establish electrical connection between the redistribution structure 320 and the redistribution structure 310, thus connecting the semiconductor chips 120 to the other semiconductor chips 100, 110 of the same package unit PU. Similarly, TIVs 420 and semiconductor chips 130 may be encapsulated in an encapsulant 230, and a redistribution structure 330 may be formed thereon to define a tier T4. The semiconductor chips 130 are disposed with front surfaces F130 facing away from the redistribution structure 320, and portions of die attach film (not shown) may secure the semiconductor chips 130 to the redistribution structure 320. In some embodiments, the TIVs 420 are vertically stacked with the TIVs 410 and 400, and the semiconductor chips 130 are vertically stacked with the semiconductor chips 120 and 110 and partially overlap with the semiconductor chips 100. The redistribution structure 330 is electrically connected to the TIVs 420 and the semiconductor chips 130. The redistribution structure 330 includes a dielectric layer 332 and a redistribution conductive layer 334. The dielectric layer 332 is patterned to form openings 336 exposing portions of the redistribution conductive layer 334. The openings 336 may be formed over the semiconductor chips 130 as well as over the TIVs 420, throughout the span of a package unit PU. In some embodiments, under-bump metallurgies 510 may optionally be conformally formed in the openings 336 the dielectric layer 332 and further extend over portions of the exposed surface of the dielectric layer 332. In some embodiments, the under-bump metallurgies 510 include multiple stacked layers. For example, the under-bump metallurgies 510 may include one or more metallic layers stacked on a seed layer. In some embodiments, connective terminals 520 are formed on the under-bump metallurgies 510. The connective terminals 510 may include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e.g., a metal pillar with a solder ball attached), or the like. In some embodiments, the connective terminals 520 are micro bumps. In a given package unit PU, the connective terminals 520 are electrically connected to the semiconductor chips 100, 110, 120, 130 through the TIVs 400, 410, 420 and the redistribution structures 300, 310, 320, 330.

In some embodiments, the scribe line regions SC in between adjacent package units PU may be devoid of conductive elements interconnecting the adjacent package units PU. That is, the scribe line regions SC may be considered as channels (corridors) of dielectric materials (the dielectric layers of the redistribution structures 300, 310, 320, 330 and the encapsulants 200, 210, 220, 230) in between package units PU. In some embodiments, grooves GR may be formed on the dielectric layer 332 of the redistribution structure 330 in correspondence of the scribe line regions SC. In some embodiments, portions of the dielectric layer 332 may be excised to form the grooves GR.

Figure 1G:
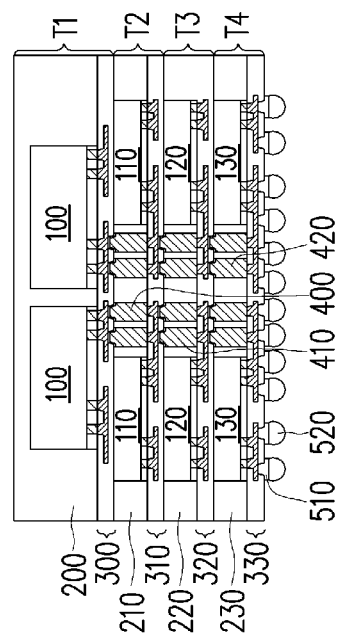

In some embodiments, the reconstructed wafer RWa is diced to separate the individual package units PU, for example by cutting along the grooves GR in the scribe line regions SC. In some embodiments, the carrier C and the de-bonding layer DB may be removed to produce the semiconductor package 10 shown in FIG. 1G. Referring to FIG. 1G, in some embodiments, the semiconductor package 10 includes multiple tiers T1-T4 of stacked semiconductor chips 100, 110, 120, 130 respectively encapsulated by encapsulants 200, 210, 220, 230. In some embodiments, the semiconductor chips 110, 120, 130 may be disposed in matching locations of the corresponding tiers T2-T4, and be slightly offset with respect to the semiconductor chips 100 of the tier T1. In some embodiments, the semiconductor chips 610A, 610B of the tier T1 are disposed closer to each other with respect to pairs of semiconductor chips 110, 120, 130 included in the other tiers T2-T4. In some embodiments, the semiconductor chips 110, 120, 130 included in the other tiers are separated by the TIVs 400, 410, 420. Each tier T1-T4 may include a corresponding redistribution structure 300, 310, 320, 330, interconnecting the semiconductor dies 100, 110, 120, 130 and the TIVs 400, 410, 420.

Figure 1H:
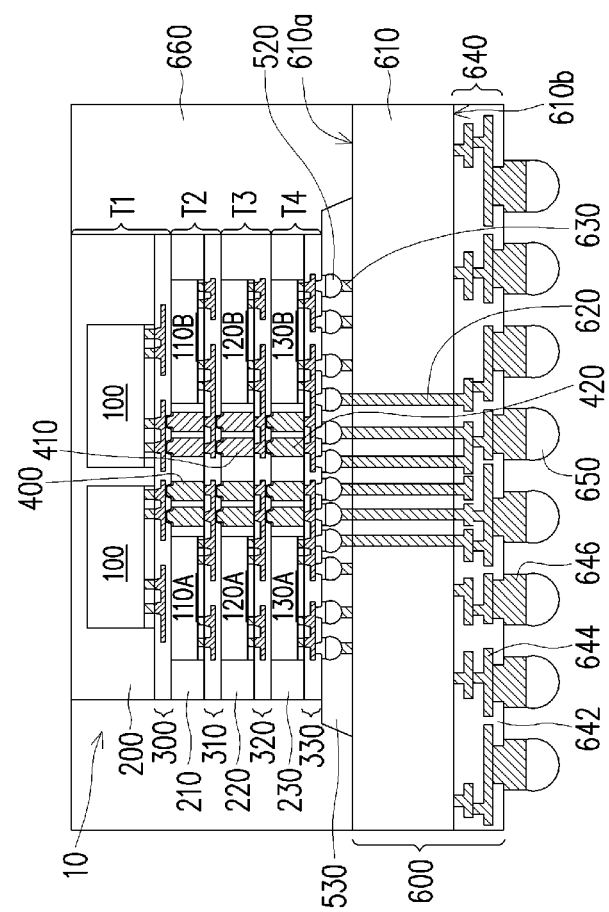
FIG. 1H is a schematic cross-sectional view of a semiconductor package according to some embodiments of the present disclosure.

The connective terminals 520 may be used to integrate the semiconductor package 10 with other components. For example, as illustrated in FIG. 1H, the semiconductor package 10 may be integrated in a larger semiconductor package (e.g., the semiconductor package 15). In the semiconductor package 15, the semiconductor package 10 is connected to a logic die 600 via the connective terminals 520. The logic die 600 includes a semiconductor substrate 610, through substrate vias (TSVs) 620, contact pads 630 disposed on a surface 610a of the semiconductor substrate 610 facing the semiconductor package 10 and an interconnection structure 640 formed on a surface 610b of the semiconductor substrate 610 opposite to the surface 610a. The logic die 600 may have a larger footprint than the semiconductor package 10. That is, a vertical projection of the semiconductor package 10 may fall entirely on the logic die 600. In some embodiments, the TSVs 620 may be formed in an area of the logic die 600 which corresponds to the area of the semiconductor package 10 in which the TIVs 400, 410, 420 are formed, however the disclosure is not limited thereto. The contact pads 630 may be formed on the ends of the TSVs 620 closer to the semiconductor package 10, as well as on regions of the semiconductor substrate 610 in which active or passive components are formed. The connective terminals 520 may be in physical and electrical contact with the contact pads 630. An underfill 530 may physically protect the connection between the connective terminals 520 and the contact pads 630. In some embodiments, the interconnection structure 640 includes a dielectric layer 642, interconnection conductive patterns 644 and under-ball metallurgies 646. The interconnection conductive patterns 644 may be embedded in the dielectric layer 642 and establish electrical contact with components formed in the semiconductor substrate 610 and with the TSVs 620. The under-ball metallurgies 646 may be disposed on a surface of the dielectric layer 642 further away from the semiconductor substrate 610, and be electrically connected to the interconnection conductive patterns 644. Conductive terminals 650 (e.g., C4 balls) may be formed on the under-ball metallurgies 646. In some embodiments, an encapsulant 660 is formed on the logic die 600 to encapsulate the semiconductor package 10 and the underfill 530. In some embodiments, the encapsulant 660 may cover the side surfaces of the semiconductor package 10 while leaving exposed the semiconductor chips 100 and the encapsulant 200 at a top surface of the semiconductor package 10.

Figure 2:
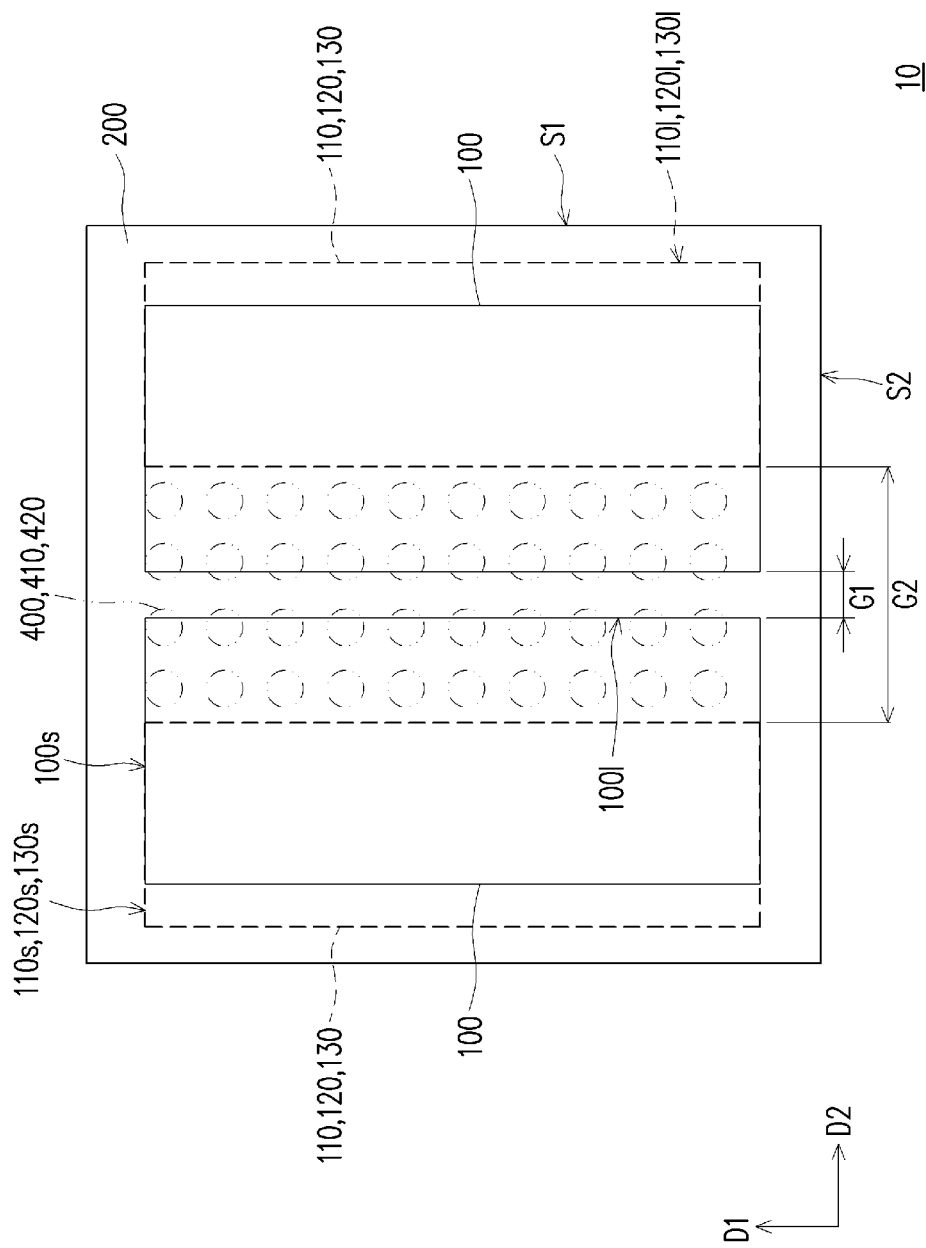
FIG. 2 is a schematic top view of a semiconductor package according to some embodiments of the present disclosure.

FIG. 2 is a schematic top view of the semiconductor package 10 according to some embodiments of the disclosure. In the schematic top view of FIG. 2 are illustrated the encapsulant 200 and the semiconductor chips 100 (solid lines), and, for illustration purpose, the footprints of the semiconductor chips 110, 120, 130 (dashed lines), and the footprints of the TIVs 400, 410, 420 (dash-dotted lines). Referring to FIG. 1G and FIG. 2, it should be noted that even though the footprints of the semiconductor chips 110, 120, 130 are shown as vertically aligned, the disclosure is not limited thereto. In some alternative embodiments, small offsets of the position of the semiconductor chips 110, 120, 130 within the corresponding tiers T1-T4 may be possible. In some embodiments, the semiconductor chips 100, 110, 120, 130 have a rectangular footprint, and are disposed within each tier T1-T4 in pairs with the corresponding longer sides 100l, 110l, 120l, 130l directed towards each other. For example, the longer sides 100l, 110l, 120l, 130l of the semiconductor chips 100, 110, 120, 130 may extend along the direction D1 illustrated in FIG. 2 and be separated from the other semiconductor chips 100, 110, 120, 130 of the same tier T1-T4 by the corresponding gaps G1 or G2 along the direction D2. The directions D1 and D2 may be orthogonal with respect to each other. The short sides 100s, 110s, 120s, 130s of the footprints of the semiconductor chips 100, 110, 120, 130 may extend along the direction D2. In some embodiments, the aspect ratio of the footprints of the semiconductor chips 100, 110, 120, 130 may be different from 1. For example, the longer sides 100l, 110l, 120l, 130l may be two, three, or more times longer than the shorter sides 100s, 110s 120s, 130s. For example, the aspect ratio of the semiconductor chips 100, 110, 120, 130 may be greater than 2 or 3. In such cases, the semiconductor package 10 have an overall rectangular footprint, with two opposite longer sides S1 and two opposite shorter sides S2. In some embodiments, the aspect ratio of the footprint of the semiconductor package 10 (a ratio of the length of the longer sides S1 to the length of the shorter sides S2) may be greater than 2 or 3.

Figure 3A:
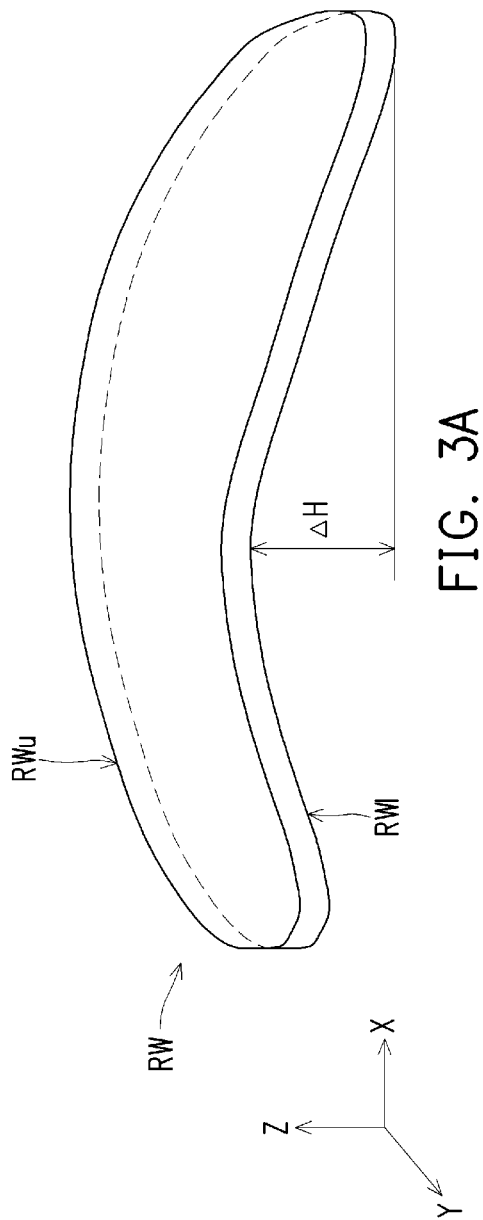
FIG. 3A and FIG. 3B are schematic perspective views of warped reconstructed wafers according to some embodiments of the present disclosure.
Figure 3B:
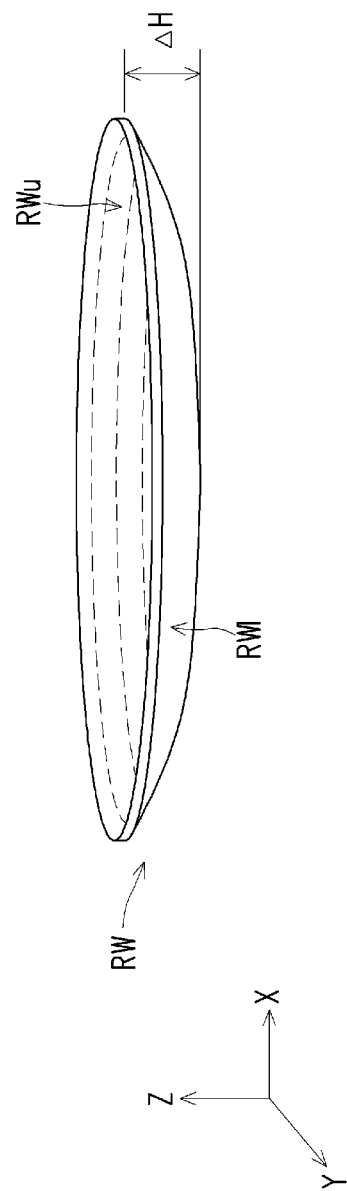

FIG. 3A and FIG. 3B are schematic perspective views of warped reconstructed wafers RW according to some embodiments of the disclosure. Referring to FIG. 2, FIG. 3A and FIG. 3B, in some embodiments, when multiple semiconductor packages are being formed as package units in a reconstructed wafer RW, heating steps may be required, for example for curing, soldering, reflowing, or the like. During these heating steps, the components included in the reconstructed wafer RW may expand, each one according to its own coefficient of thermal expansion (CTE). For example, components made mostly of metallic materials (such as the TIVs 400, 410, 420) or semiconductor materials (such as the semiconductor chips 100, 110, 120, 130) may have a different thermal behavior than the dielectric materials (e.g., the encapsulants 200, 210, 220, 230, or the dielectric layers of the redistributions structures 300, 310, 320, 330 illustrated in FIG. 1F). As a result of this difference in thermal behavior, the reconstructed wafer RW may become deformed, i.e., warped, along one or more directions. For example, as illustrated in FIG. 3A, a reconstructed wafer RW may undergo "saddle-type" warpage, bending towards the negative Z direction along the X direction, and bending towards the positive Z direction along the Y direction. In some alternative embodiments, as illustrated in FIG. 3B, the reconstructed wafer RW may undergo "potato-type" or "concentric-type" warpage. In these embodiments, the edges of the reconstructed wafer RW may deform in the Z direction with respect to the central region of the reconstructed wafer RW. For example, the edge of the reconstructed wafer RW may be located at a higher level height along the Z direction than the central part of the reconstructed wafer RW. In some alternative embodiments, the edge of the reconstructed wafer RW may be located at a lower level height along the Z direction than the central part of the reconstructed wafer RW. In some embodiments, the deformation of the edge in the Z direction may happen at a substantially same amount along the X and Y direction (concentric-type warpage). In some alternative embodiments, the deformation in the Z direction of the edge may be stronger along one direction (e.g., the X direction) than the other direction (e.g., the Y direction). In such cases, the warpage is referred to as potato-type. As illustrated in the embodiments of FIG. 3A and FIG. 3B, the upper surface RWu and the lower surface RW1 of the reconstructed wafer RW may deform out of plane, becoming significantly curved. In some embodiments, the height difference (difference in height level) ΔH along the Z direction existing between the highest point and the lowest point of the top surface RWu or the lower surface RW1 of the reconstructed wafer RW may be taken as a measure of the warpage of a reconstructed wafer RW. In FIG. 3A and FIG. 3B the height difference ΔH is indicated with respect to the lower surface RW1 for illustrative purposes. In some alternative embodiments, the height difference ΔH may be considered with respect to the top surface RWu, depending on whichever of the two values is greater. In some embodiments, excessive warpage (e.g., a too large height difference ΔH) of the reconstructed wafer RW may render impossible performing subsequent steps of the manufacturing process, thus reducing the process yield and increasing the manufacturing costs. In some embodiments, warpage of the reconstructed wafer RW may be alleviated by controlling the relative orientations of the package units within the reconstructed wafer RW. In some embodiments, when the package units have rectangular footprints with a high aspect ratio (e.g., greater than 2 or 3), if the package units are oriented all in a same first direction (e.g., with the longer sides S1 illustrated in FIG. 2 oriented along the X direction), the number of scribe line regions or the scribe line region number SLN (e.g., the amount of the scribe line regions SC illustrated in FIG. 1F) extending along the first direction throughout the reconstructed wafer RW may be significantly higher than the number of scribe line regions (the scribe line region number) SLN extending throughout the reconstructed wafer RW along a second direction (e.g., the direction Y) perpendicular to the first direction. When there is a difference or the difference in the numbers of scribe line regions SLNs extending along different directions is high, the reconstructed wafer RW may tend to deform because of the different thermal behaviors of the scribe line regions filled by sole dielectrics (e.g., the encapsulants) with respect to the regions of the package units in which other materials are present. On the other hand, when the numbers of scribe lines regions SLNs extending along different directions may be equalized or balanced, the warpage experienced by the reconstructed wafer RW may be alleviated. For example, if there are as many scribe line regions extending in the first direction (e.g., the X direction) than in the second direction (e.g., the Y direction), the reconstructed wafer RW may tend to warp less, thus allowing the following manufacturing process to proceed. In some embodiments, the ratio of the scribe line region number SLN extending in a first direction to the scribe line region number SLN extending in a second direction may be in the range from 1:1 to 1:2.

Figure 4A:
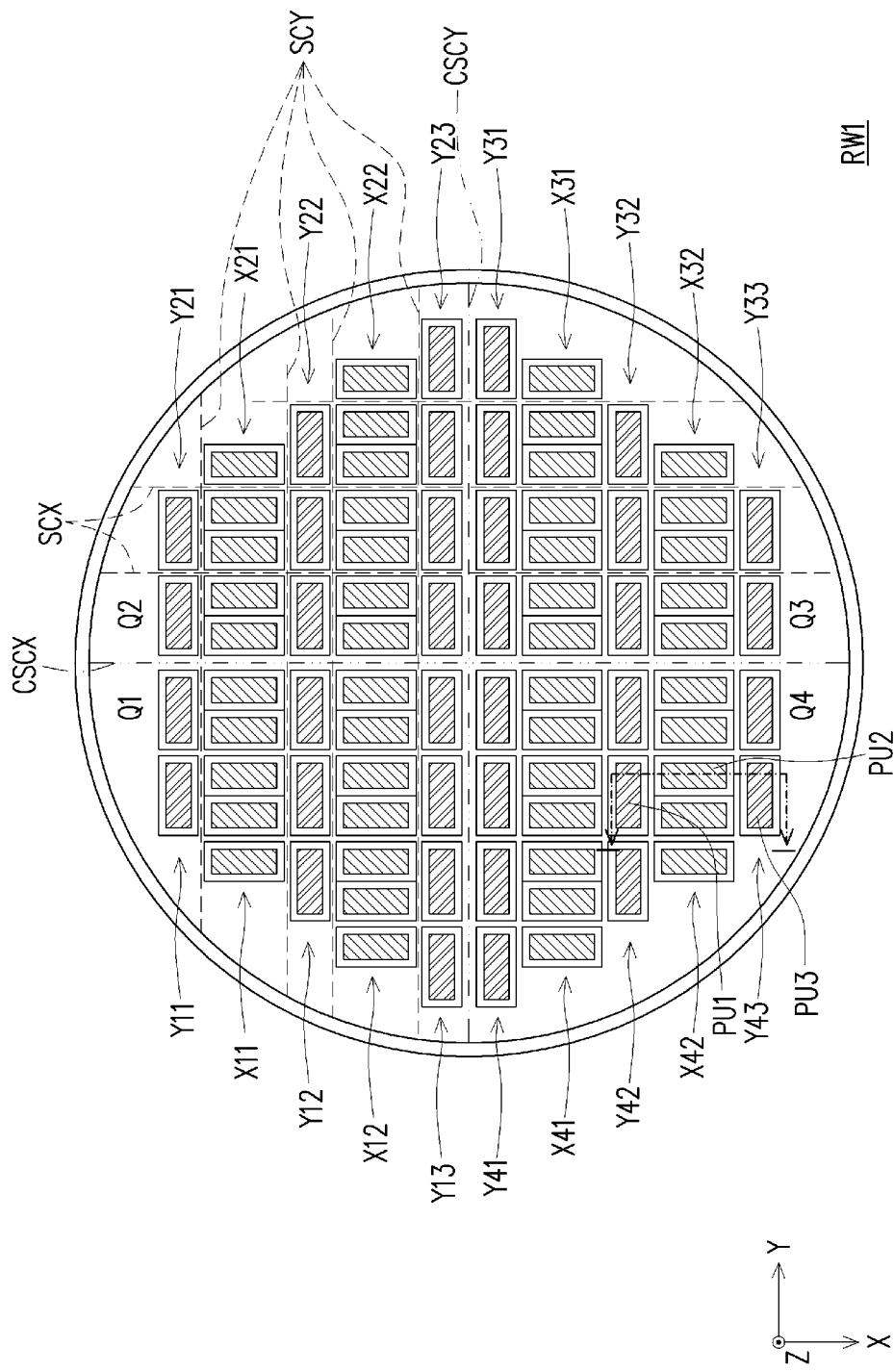
FIG. 4A to FIG. 4F are schematic top views of reconstructed wafers according to some embodiments of the present disclosure.

FIG. 4A through FIG. 4F are schematic top views of some reconstructed wafers according to some embodiments of the disclosure. In the schematic top views of FIG. 4A through FIG. 4F, the positions of the package units PU are indicated together with the positions of scribe line regions SC (dashed lines). The scribe line regions SC are labelled as "X" or "Y" according to their extending direction. Referring to FIG. 4A, in some embodiments, the package units PU in the reconstructed wafer RW1 may be disposed according to a maximum common factor pattern. The reconstructed wafer RW1 may be divided in four quadrants Q1-Q4 by two intersecting central scribe line regions CSCX and CSCY. In some embodiments, each of the central scribe line regions CSCX, CSCY also divides the reconstructed wafer RW1 in two halves. For example, the central scribe line region CSCX defines one half (a western half) formed by the quadrants Q1 and Q4 and another half (an eastern half) formed by the quadrants Q2 and Q3. Similarly, the central scribe line region CSCY defines one half (a northern half) formed by the quadrants Q1 and Q2 and another half (a southern half) formed by the quadrants Q3 and Q4. In some embodiments, the package units PU in the reconstructed wafer RW1 are disposed in lines, which lines extend along the Y direction. Within each line, the package units PU are all oriented with longer sides along the X direction or along the Y direction ("oriented along the X direction" or "oriented along the Y direction", respectively), and the line is labelled accordingly. For example, a line of package units PU labelled as "X" indicates that the package units PU of the line are oriented along the X direction (an "X line"), and a line of package units PU labelled as Y indicates that the package units PU of the line are oriented along the Y direction (a "Y line"). In the drawings, the lines are further identified by a two digits label, in which the first digit indicates the quadrant Q1, Q2, Q3 or Q4 of the reconstructed wafer RW1 in which the line is located and the second digit increases progressively within the quadrant Q1-Q4 proceeding towards the positive X direction from the northern edge of the reconstructed wafer RW1. So, for example, the line Y11 is the first line encountered in the first quadrant Q1 in which the package units PU are oriented along the Y direction when proceeding towards the positive X direction from the northern edge of the reconstructed wafer RW1. Similarly, the line Y12 is the second line encountered in the first quadrant Q1 in which the package units are oriented along the Y direction when proceeding towards the positive X direction from the northern edge of the reconstructed wafer RW1. As illustrated in FIG. 4A, within the quadrants Q1-Q4 X lines are alternately disposed with Y lines proceeding towards the positive X direction. As a result, package units PU oriented along the X direction may be flanked by two other package units PU oriented along the Y direction, and package units oriented along the Y direction may be flanked by two other package units PU oriented along the X direction. This disposition is similar to the one illustrated in the cross-sectional views of FIG. 1A to FIG. 1F, which may be considered to be taken along the line I-I illustrated in FIG. 4A. In the reconstructed wafer RW1 illustrated in FIG. 4A, there are package units PU which are flanked along the Y direction by package units PU oriented in the same manner and are flanked along the X direction by package units PU which are oriented along a different manner. The package units PU2 and PU3 are examples of such package units PU. In some embodiments, when the package units PU have a high aspect ratio, the alternating Y lines and X lines result in scribe line regions SCY being unequally spaced along the X direction. For example, the distance along the X direction between two scribe line regions SCY at the sides of a Y line is going to be shorter than the distance along the X direction between two scribe line regions SCY at the sides of an X line. In some embodiments, multiple package units PU oriented along the X direction may be disposed between adjacent scribe line regions SCX. While each quadrant Q1-Q4 is illustrated as including five lines, the disclosure is not limited thereto, and more or fewer lines may be formed depending, for example, on the relative sizes of the package units PU and the reconstructed wafer RW1.

As illustrated in FIG. 4A, the lines of the quadrant Q1 may be aligned with the lines of the quadrant Q2, and the lines of the quadrant Q3 may be aligned with the lines of the quadrant Q4. That is, to the line Y11 in the quadrant Q1 may correspond the line Y21 in the quadrant Q2, and so on. In some embodiments, the central scribe line regions CSCX, CSCY may be C2 rotation symmetry axes for the positions of the package units PU within the quadrants Q1-Q4. As such, the last line Y13 of the quadrant Q1 may be located between the line X12 in the same quadrant Q1 and the line Y41 in the quadrant Q4. That is, two adjacent Y lines may be disposed at the two sides of the central scribe lines CSCY extending in the Y direction.

In some embodiments, by disposing the package units PU in a maximum common factor pattern, scribe line regions SC extending from one quadrant Q1-Q4 of the reconstructed wafer RW to an adjacent quadrant Q1-Q4 are reduced in number, and, furthermore, the number of scribe line region SCX may be balanced with respect to the number of scribe line regions SCY. For example, as illustrated for the quadrant Q2, if also the central scribe line regions CSCX and CSCY are counted, there are five scribe line regions SCY and three scribe line regions SCX. Additional scribe line segments (not illustrated) may be present between package units PU of the X lines in between adjacent scribe line regions SCX. However, such additional scribe line segments are rather short, and, if at all, provide only minor contributions to the warpage of the reconstructed wafer RW1. As the scribe line regions SCX and SCY which mostly contribute to the warpage of the reconstructed wafer RW1 are balanced in number, the reconstructed wafer RW1 tends to warp less with respect to the case in which all the package units PU are oriented along the same direction. In some embodiments, the height difference ΔH (illustrated, e.g., in FIG. 3A or 3B) may be reduced up to about 25% with respect to the case in which all the package units PU are oriented along the same direction. In some embodiments, the singulation of the reconstructed wafer RW1 may be performed by employing a laser saw.

Figure 4B:
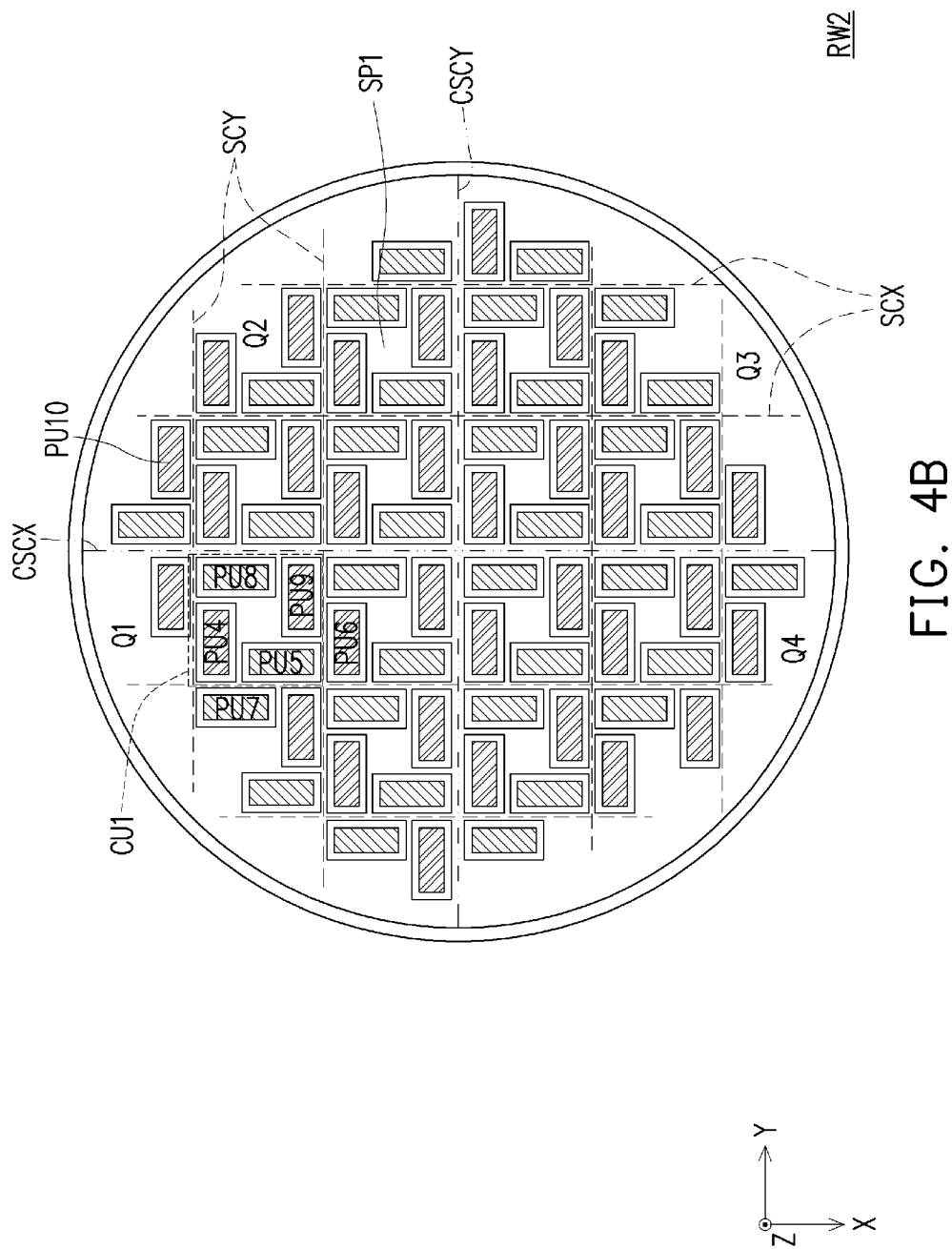

FIG. 4B is a schematic top view of a reconstructed wafer RW2 according to some embodiments of the disclosure. In the reconstructed wafer RW2 the package units PU are arranged in an interweave pattern. That is, the package units PU may be disposed with alternating orientations along intersecting columns and rows. For example, considering the package unit PU4 in the quadrant Q1, the package unit PU4 is oriented along the Y direction and is part of a column extending along the X direction and a row extending along the Y direction. Moving along the column towards the positive X direction, the package PU4 is followed by the package PU5 oriented along the X direction and the package PU6 oriented along the Y direction, and so on. Similarly, considering the row to which the package unit PU4 belongs, the package unit PU4 is preceded along the Y direction by the package unit PU7 oriented along the X direction, and is followed along the Y direction by the package unit PU8 oriented along the X direction. The interweaving pattern of rows and columns of package units PU may define a plurality of cell units CU enclosed on the sides by the scribe line regions SCX and SCY. For example, as illustrated in FIG. 4B, in a cell unit CU1 there may be included four package units PU (e.g., PU4, PU5, PU8, PU9), of which two package units (PU4, PU9) are oriented along the Y direction and two package units (PU5, PU9) are oriented along the X direction. The package units PU of a cell unit CU may be disposed along the edges of the cell unit CU. For example, as illustrated in FIG. 4B, the cell unit CU1 has a quadrangular footprint, and the package units PU constituting the cell unit CU1 are disposed along the edges of the quadrangle. In some embodiments, the quadrangular unit may be rectangular or square. In some embodiments, depending on the actual footprint of the package units PU, spaces SP (e.g., the space marked as SP1) may remain at the center of the cell units CU, where no package unit PU is disposed. In some embodiments, such spaces SP may be filled by dielectric materials (e.g., encapsulants, dielectric layers of redistribution structures, etc.). In some embodiments, towards the edge of the reconstructed wafer RW2 there may be package units PU which are disposed in the rows or columns of the interweave pattern without being part of any cell unit CU, as is the case, for example, for the package units PU7 and PU10. In some embodiments, in the attempt to maximize the number of package units PU produced in the reconstructed wafer RW2, the rows and columns of package units PU are extended as much as possible close to the edges of the reconstructed wafer RW2, thus resulting in incomplete cell units. In some embodiments, the positions of the package units PU in the quadrants Q1-Q4 in which the reconstructed wafer RW2 is divided by the central scribe line regions CSCY, CSCX may be symmetric with each other following a rotation of π/2 radians in the plane defined by the X and Y directions with respect to the point of intersection of the central scribe line regions CSCY, CSCX. That is, an axis extending along the Z direction and passing through the intersection of the central scribe line regions CSCY, CSCX may be a C4 rotational symmetry axis for the positions of the package units PU within the reconstructed wafer RW2.

In some embodiments, by disposing the package units PU in an interweave pattern, scribe line regions SC extending across quadrants Q1-Q4 are reduced in number, and, furthermore, the number of scribe line regions SCX may be balanced with respect to the number of scribe line regions SCY. For example, as illustrated for the quadrant Q2, if also the central scribe line regions CSCX and CSCY are counted, there are three scribe line regions SCY and three scribe line regions SCX. In some embodiments, the scribe line regions SCX and SCY are equally spaced from other scribe line regions SCX and SCY extending in the same direction. For example, the scribe line regions SCX may be equally spaced along the Y direction, and the scribe line regions SCY may be equally spaced along the X direction. Additional scribe line segments (not illustrated) may be present between adjacent package units PU. However, such additional scribe line segments are rather short, and, if at all, provide only minor contributions to the warpage of the reconstructed wafer RW2. As the scribe line regions SCX and SCY which mostly contribute to the warpage of the reconstructed wafer RW2 are balanced in number, the reconstructed wafer RW2 tends to warp less with respect to the case in which all the package units PU are oriented along the same direction. In some embodiments, the height difference ΔH (illustrated, e.g., in FIG. 3A or 3B) may be reduced up to about 75% with respect to the case in which all the package units PU are oriented along the same direction. In some embodiments, the singulation of the reconstructed wafer RW2 may be performed by employing a laser saw.

Figure 4C:
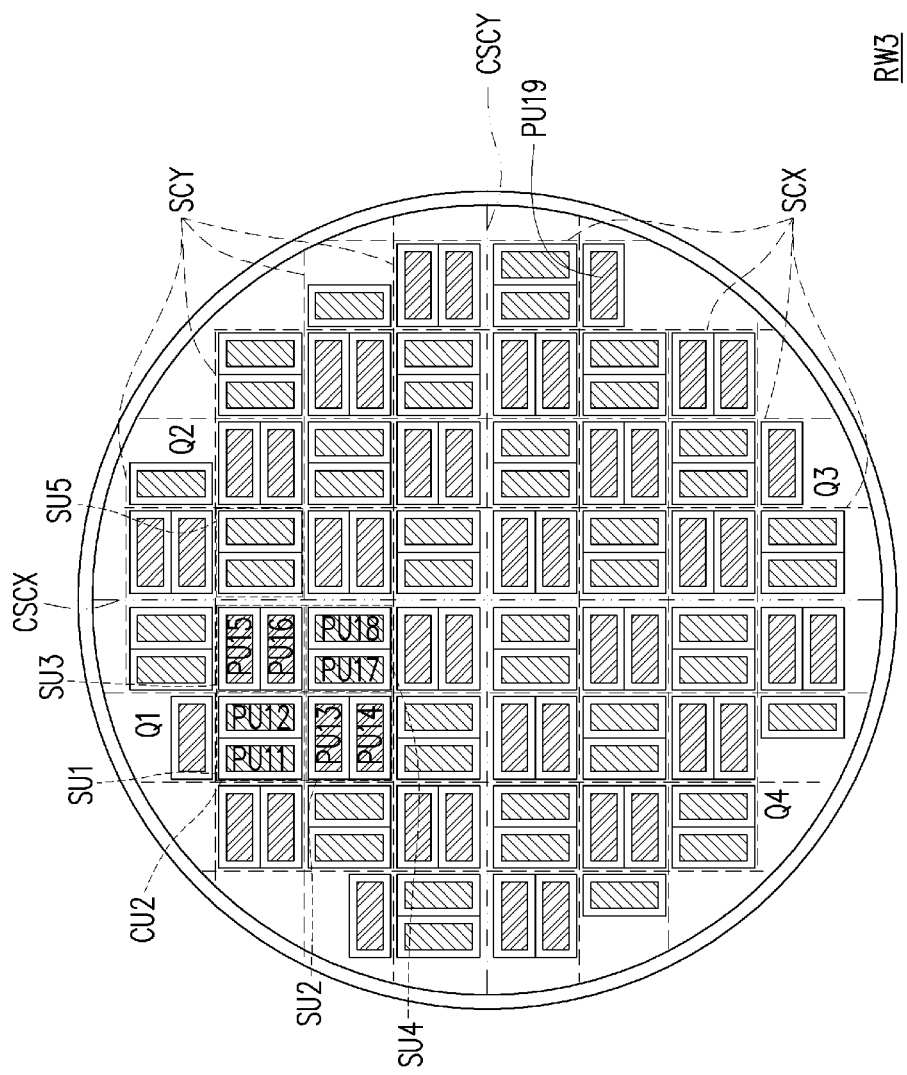

FIG. 4C is a schematic top view of a reconstructed wafer RW3 according to some embodiments of the disclosure. In the reconstructed wafer RW3 the package units PU are arranged in a complementary interweave pattern. Similar to the what described above for the reconstructed wafer RW2 of FIG. 4B, in the reconstructed wafer RW3 the package units PU are disposed in intersecting rows and columns, with alternating orientations along a given row or column. However, differently than in the reconstructed wafer RW2, the package units PU are disposed in pairs (referred to as subunits SU) along the columns and rows. In each subunit SU, the package units PU are disposed side by side with respect to the longer sides. For example, in the subunit SU1 the package units PU11 and PU12 are oriented along the X direction and disposed side by side (adjacent with respect to each other) along the Y direction, while in the subunit SU2 the package units PU13 and PU14 are oriented along the Y direction and disposed side by side along the X direction. The package unit PU13 is adjacent to both the package unit PU11 and the package unit PU12 along the X direction. Scribe line segments (not shown) may separate the package units PU within a subunit SU. As illustrated in FIG. 4C, the package units PU of adjacent subunits SU are oriented along different directions when proceeding along a column or a row. For example, the package units PU15, PU16 of the subunit SU3 are oriented along the Y direction, and the subunit SU3 is preceded and followed along a row by the subunits SU1, SU5 having the package units PU oriented along the X direction. In some embodiments, the interweaving rows and columns may define cell units CU (e.g., the cell units CU2) in a similar fashion as previously described for the reconstructed wafer RW2. However, in the cell units CU of the reconstructed wafer RW3, subunits SU of package units PU, rather than individual package units PU, are disposed along the edges of the cell units CU. Furthermore, depending on the aspect ratio of the package units PU, it may be possible to form cell units CU without a central empty space (as it was the case, instead, for the reconstructed wafer RW2 of FIG. 4B). That is, by disposing the package units PU in a complementary interweave pattern, it may be possible to contain the amount of empty spaces of the reconstructed wafer RW3. Also, in the reconstructed wafer RW3 incomplete cell units or subunits may be formed toward the edges of the reconstructed wafer RW3 in the attempt to maximize the number of package units PU produced. In some embodiments, the number of package units PU in a subunit SU may be adjusted depending on the aspect ratio of the package units PU. For example, if the aspect ratio is particularly high, a subunit SU may include three or more package units PU, rather than a pair. In some embodiments, an axis extending along the X direction and passing through the intersection point of the central scribe line region CSCX, CSCY may be a C4 rotational symmetry axis for the positions of the package units PU.

In some embodiments, by disposing the package units PU in a complementary interweave pattern, scribe line regions SC extending across adjacent quadrants Q1-Q4 are reduced in number, and, furthermore, the number of scribe line regions SCX may be balanced with respect to the number of scribe line regions SCY. For example, as illustrated for the quadrant Q2, if also the central scribe line regions CSCX and CSCY are counted, there are five scribe line regions SCY and five scribe line regions SCX. In some embodiments, the scribe line regions SCX, SCY may be equally spaced along the Y direction and the X direction, respectively. Additional scribe line segments (not illustrated) may be present between adjacent package units PU within the subunits SU. However, such additional scribe line segments are rather short, and, if at all, provide only minor contributions to the warpage of the reconstructed wafer RW3. As the scribe line regions SCX and SCY which mostly contribute to the warpage of the reconstructed wafer RW3 are balanced in number, the reconstructed wafer RW3 tends to warp less with respect to the case in which all the package units PU are oriented along the same direction. In some embodiments, the height difference ΔH (illustrated, e.g., in FIG. 3A or 3B) may be reduced up to about 80% with respect to the case in which all the package units PU are oriented along the same direction. In some embodiments, the singulation of the reconstructed wafer RW3 may be performed by employing a laser saw.

Figure 4D:
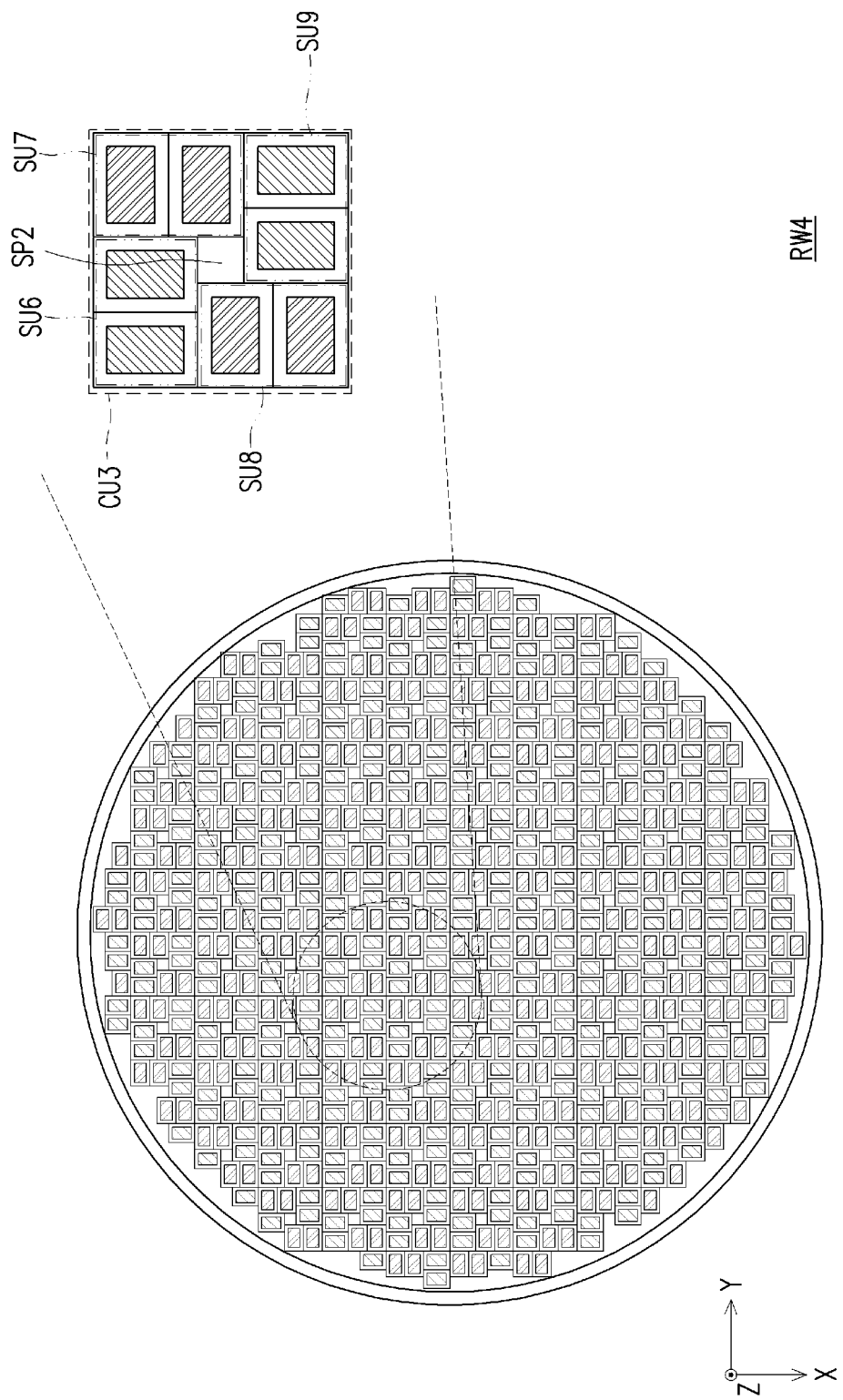

FIG. 4D is a schematic top view of a reconstructed wafer RW4 according to some embodiments of the disclosure. In the reconstructed wafer RW4 the package units PU are arranged in a complementary interweave pattern, similarly to what was previously described for the reconstructed wafer RW3 of FIG. 4C. A difference between the reconstructed wafer RW4 and the reconstructed wafer RW3 of FIG. 4C lies in the fact that a space SP (e.g., the space SP2) exists in the central region of the cell units CU (e.g., the cell unit C3). That is, the subunits SU6-SU9 forming the cell unit CU3 may have a higher aspect ratio than the subunits SU1-SU4 forming the cell units CU2 illustrated in FIG. 4C. As a result, a space SP2 remains within the cell unit CU3. Another difference between the reconstructed wafer RW4 and the reconstructed wafer RW3 lies in the lack of one or both of the central scribe lines CSCX or CSCY (illustrated in FIG. 4C). In some embodiments, the reconstructed wafer RW4 is not divided in quadrants as the reconstructed wafer RW3. Whether or not central scribe line regions CSCX or CSCY are formed may depend on the aspect ratio of the package units PU, which affects, in turn, the aspect ratio of the subunits SU and the cell units CU. However, also in the case of the reconstructed wafer RW4 the number of the scribe line regions SCX, SCY extending across different hemicycles (which would correspond to the halves of the reconstructed wafer were the central scribe line regions CSCX, CSCY formed) of the reconstructed wafer RW4 are balanced in the number.

Figure 4E:
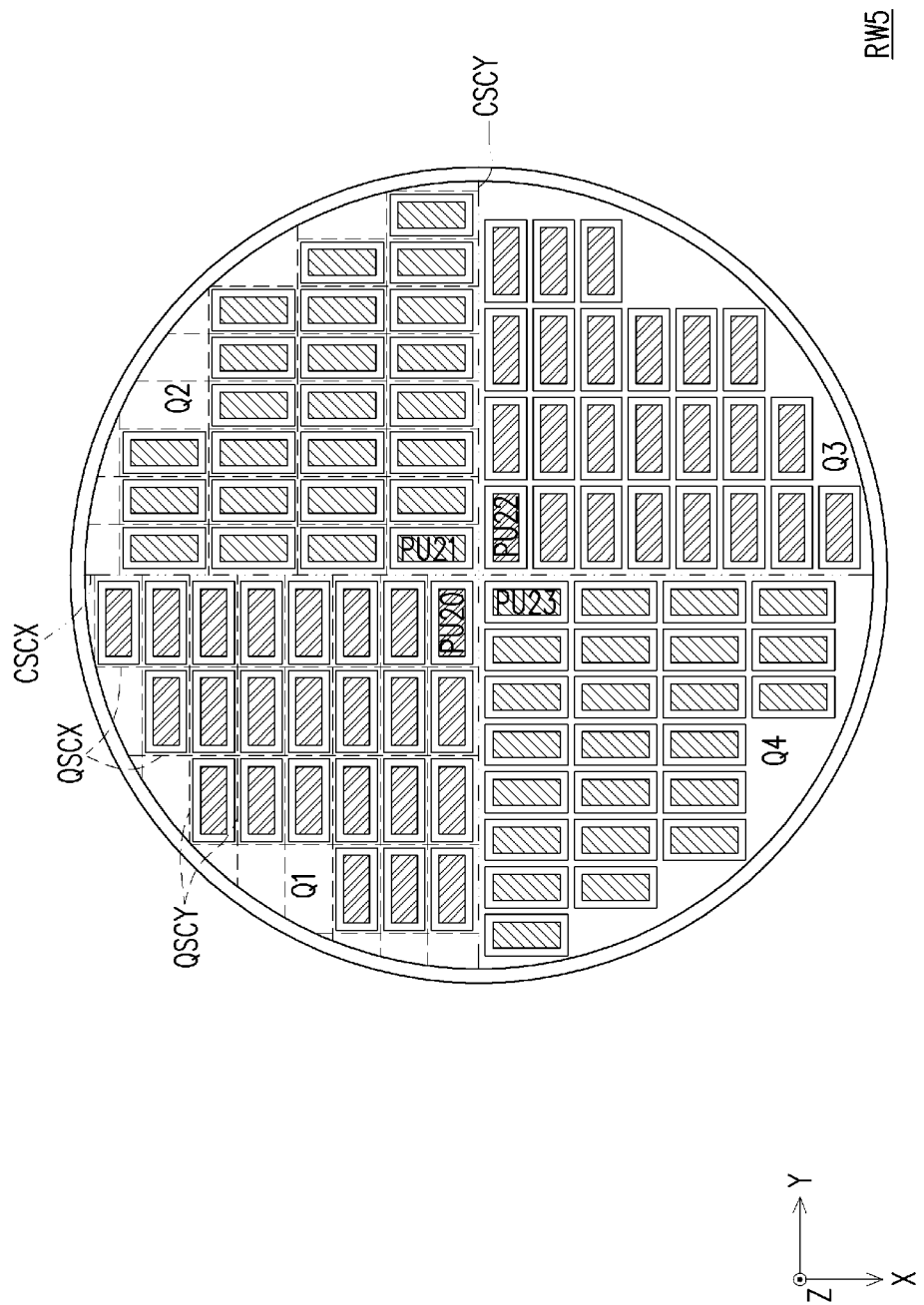

FIG. 4E is a schematic top view of a reconstructed wafer RW5 according to some embodiments of the disclosure. In the reconstructed wafer RW5, the package units PU are arranged according to a quarter interweave pattern. The central scribe line regions CSCX and CSCZ divide the reconstructed wafer RW5 into four quadrants Q1-Q4. Within each quadrant Q1-Q4, the package units PU are all oriented along the same direction. For example, the package units PU of the quadrant Q1 are all oriented along the Y direction. Furthermore, the package units PU of adjacent quadrants (such as the quadrant Q1 with the quadrant Q2 or Q4) are oriented along different directions. That is, if the package units PU of the quadrant Q1 are oriented along the Y direction, then the package units PU of the adjacent quadrants Q2 and Q4 are oriented along the X direction. By doing so, the package units PU disposed away from the central scribe line regions CSCX may be surrounded or have as adjacent package units PU other package units oriented in the same manner. However, the package units PU disposed along the central scribe line regions (e.g., the package units PU20-PU23) also have adjacent package units PU oriented in a different manner. For example, the package unit PU20, oriented along the Y direction, is adjacent to package units PU21 and PU23 which are oriented along the X direction. In some embodiments, the axis extending along the Z direction and passing through the point of intersection of the central scribe lines CSCX, CSCY may be a C4 symmetry axis for the disposition of the package units PU in the reconstructed wafer RW5.

In some embodiments, by disposing the package units PU in a quarter interweave pattern, the number of scribe line regions extending across the entire reconstructed wafer RW5 may be balanced. Depending on the aspect ratio of the package units PU, it may happen that only the central scribe lines CSCX, CSCY extend across adjacent quadrants Q1-Q4 of the reconstructed wafer RW5, while the other scribe line regions QSCY, QSCX are confined within the corresponding quadrant Q1-Q4. For example, as illustrated for the quadrants Q1 and Q2, the respective scribe line regions QSCY, QSCX do not extend further than the central scribe line regions CSCX or CSCY. In some alternative embodiments, depending on the aspect ratio of the package units PU, some, but possibly not all, of the scribe line regions QSCY, QSCX may extend between adjacent quadrants Q1-Q4 (similar to the scribe line regions SCX, SCY of the reconstructed wafers RW1-RW4 illustrated in FIG. 4A to 4D). However, the number of scribe line regions extending across different quadrants Q1-Q4 of the reconstructed wafer RW5 would still be reduced (and, possibly, more balanced) with respect to the case in which all the package units PU of the reconstructed wafer are oriented along the same direction. As the scribe line regions which mostly contribute to the warpage of the reconstructed wafer RW5 are reduced and balanced in number, the reconstructed wafer RW5 tends to warp less with respect to the case in which all the package units PU are oriented along the same direction. In some embodiments, the height difference ΔH (illustrated, e.g., in FIG. 3A or 3B) may be reduced up to about 80% with respect to the case in which all the package units PU are oriented along the same direction. Furthermore, with a quadrant interweave pattern, it may be possible, in some embodiments, to avoid decrease of the package counts (i.e., the number of package units PU included in the reconstructed wafer RW5). That is, in some embodiments, wasted space in the reconstructed wafer RW5 may be kept at a minimum.

In some embodiments, the singulation of the reconstructed wafer RW5 may be performed in two steps by employing a mechanical die saw. For example, in a first step the individual quadrants Q1-Q4 may be singulated by cutting along the central scribe line regions CSCX, CSCY. Furthermore, because the package units PU within each quadrant Q1-Q4 are all oriented along the same direction, each quadrant Q1-Q4 may be individually singulated in a second step also employing a mechanical die saw. In some embodiments, even though multiple singulation steps are performed, use of a mechanical die saw may reduce the costs associated with the singulation process.

Figure 4F:
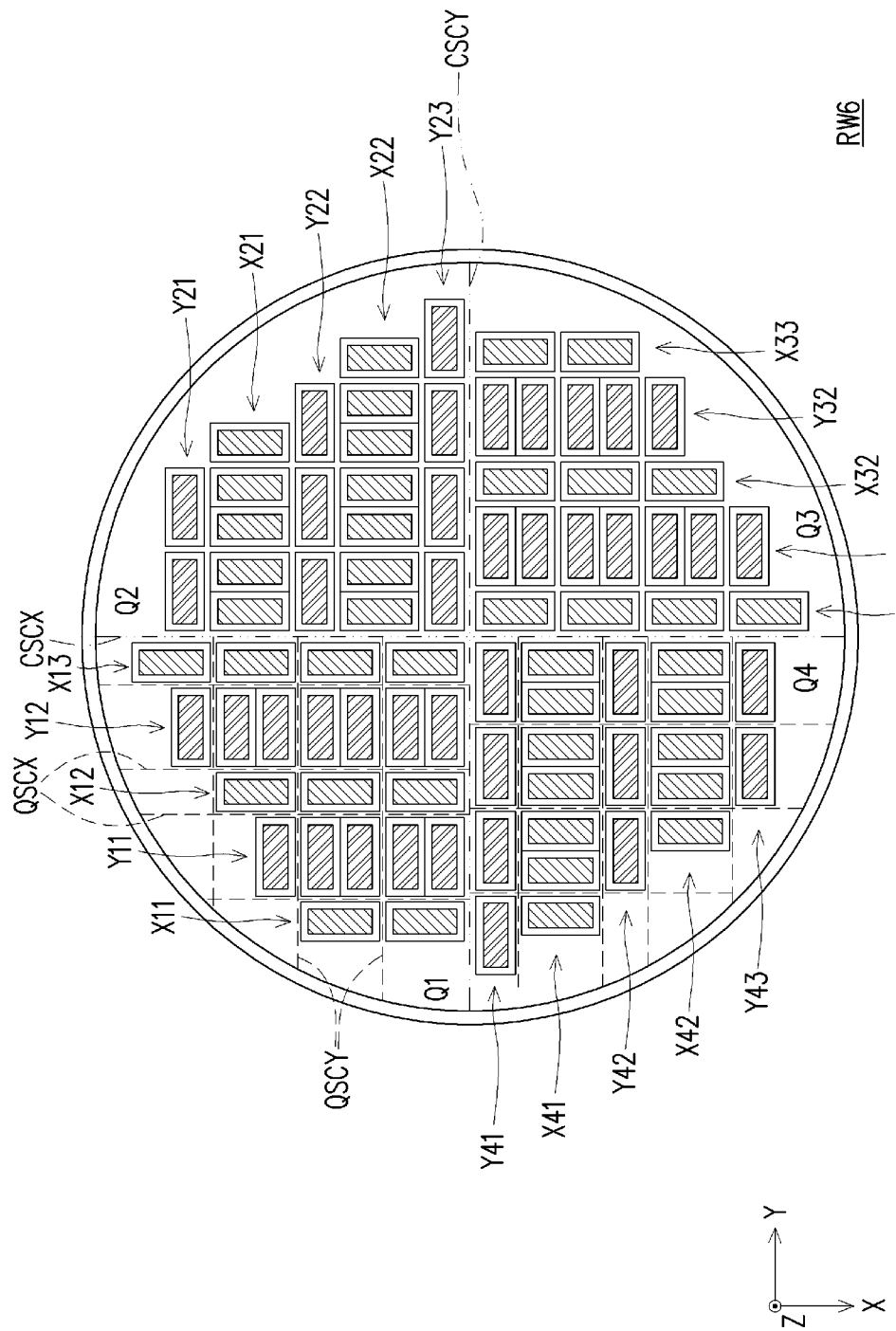

FIG. 4F is a schematic top view of a reconstructed wafer RW6 according to some embodiments of the disclosure. In the reconstructed wafer RW6, the package units PU are arranged according to a quarter interweave pattern with a maximum common factor arrangement within each quadrant Q1-Q4. That is, the central scribe line regions CSCX, CSCY divide the reconstructed wafer RW6 in quadrants Q1-Q4, similarly to what was previously described with reference to the reconstructed wafer RW6 of FIG. 4E and RW1 of FIG. 4A. Within each quadrant Q1-Q4, the package units PU oriented along the same direction are arranged in lines, similarly to what was previously described with reference to the reconstructed wafer RW1 of FIG. 4A. For example, in the quadrant Q1 the package units PU are arranged in lines extending along the X direction, and within each line, the package units PU are all oriented along the X direction or the Y direction. The X lines and the Y lines are alternately arranged within the quadrant Q1. However, in the reconstructed wafer RW5, the lines of adjacent quadrants Q1-Q4 extend along different directions. In FIG. 4F, within each quadrant Q1-Q4, the lines are numbered as described above with reference to FIG. 4A, with the exception that different directions may be considered for the numbering for different quadrants. For example, in the quadrants Q1 and Q3, the lines, which extend along the X direction, are progressively numbered according to the Y direction from the western edge of the reconstructed wafer RW6, while in the quadrants Q2 and Q4, the lines, which extend along the Y direction, the lines are progressively numbered along the X direction from the northern edge of the reconstructed wafer RW6. So, as illustrated in FIG. 4F for the quadrant Q1, a first line X11 is followed, in order, by the lines Y11, X12, Y12, and X13, for example. In some embodiments, the axis extending along the Z direction and passing through the point of intersection of the central scribe lines CSCX, CSCY may be a C4 symmetry axis for the disposition of the package units PU in the reconstructed wafer RW6.

In some embodiments, by disposing the package units PU in a quarter interweave pattern, the number of scribe line regions extending across different quadrants of the reconstructed wafer RW6 may be balanced. As illustrated in FIG. 4F for the quadrants Q1 and Q4, in some embodiments the difference in extending directions of the lines and the aspect ratio of the package units PU may result in quadrant scribe line regions QSCX, QSCY extending up to (but not beyond) the central scribe line regions CSCX and CSCY. In some alternative embodiments, depending on the aspect ratio of the package units PU, some, but possibly not all, of the quadrant scribe line regions QSCY, QSCX may extend between adjacent quadrants Q1-Q4 (as illustrated, for example, for the scribe line regions SCX, SCY in FIG. 4A). However, the number of these scribe line regions extending across the entire reconstructed wafer RW6 would still be reduced (and, possibly, more balanced) with respect to the case in which all the package units PU across the entire reconstructed wafer are oriented along the same direction. As the scribe line regions which mostly contribute to the warpage of the reconstructed wafer RW6 are reduced and balanced in number, the reconstructed wafer RW6 tends to warp less with respect to the case in which all the package units PU are oriented along the same direction. In some embodiments, the height difference ΔH (illustrated, e.g., in FIG. 3A or 3B) may be reduced up to about 85% with respect to the case in which all the package units PU are oriented along the same direction. In some embodiments, the reconstructed wafer RW6 may be singulated employing a laser saw.

In some embodiments, the package units PU may be disposed in the reconstructed wafer RW illustrated in FIG. 1B to 1F according to any one of the patterns described with respect to FIG. 4A to FIG. 4F or variants thereof. However, it will be apparent that while the process of FIG. 1A to FIG. 1G was illustrated for package units PU resulting in the semiconductor package 10, the disclosure is not limited by the structure of the semiconductor package produced. That is, the configuration of the reconstructed wafer RW may be applied to any types of package unit, and the disclosure does not pose any limits as to the structure of the semiconductor package produced. Those skilled in the art will appreciate that the structures of the reconstructed wafers discussed above may benefit the manufacture of semiconductor packages and devices different (e.g., including different components) than the ones illustrated in FIG. 1A to FIG. 1G of the disclosure.

Figure 5:
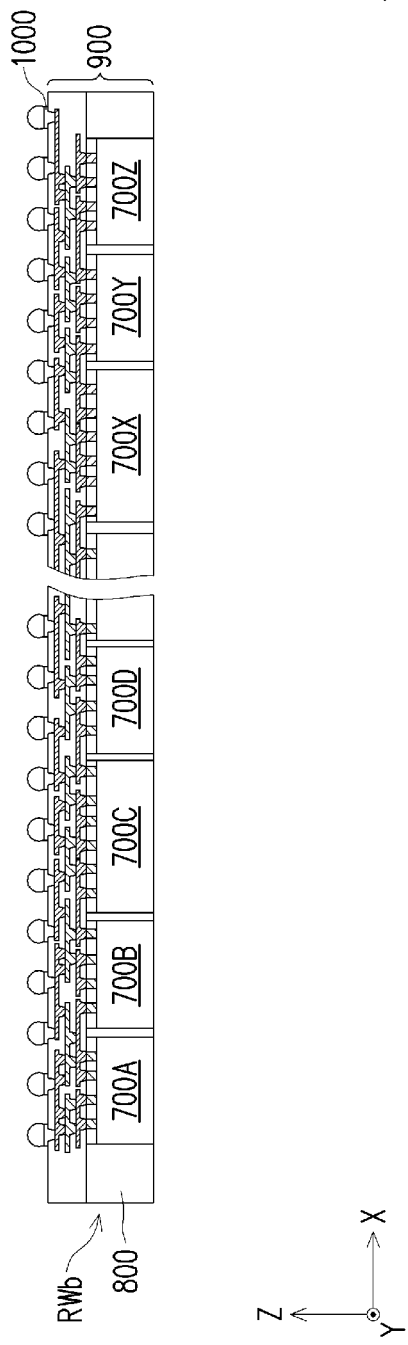
FIG. 5 is a schematic cross-sectional view of a wafer-size semiconductor package according to some embodiments of the present disclosure.

FIG. 5 is a schematic cross-sectional view of a wafer-size semiconductor package 20 according to some embodiments of the disclosure. In some embodiments, the wafer-size semiconductor package 20 has a diameter of in the range from about 4 inches to about 20 inches. The wafer-size semiconductor package 20 may include a reconstructed wafer structure, in which a plurality of semiconductor packages or chips 700A-700Z is encapsulated by an encapsulant 800 in a wafer form, and is interconnected through a redistribution structure 900. Connective terminals 1000 may be disposed on the redistribution structure 900 to integrate the wafer-size semiconductor package 20 into larger electronic devices (not shown). In some embodiments, the wafer-size semiconductor package 20 may be fabricated following similar processes as previously described with reference to FIG. 1A to FIG. 1C. Namely, the semiconductor packages or chips 700A-700Z may be disposed on a carrier (not shown), the encapsulant 800 may be formed laterally wrapping the semiconductor packages or chips 700A-700Z to form a reconstructed wafer RWb, and the redistribution structure 900 may be formed on the encapsulant 800 and the semiconductor packages or chips 700A-700Z. The connective terminals 1000 may then be provided on the redistributions structure 900. A difference with the previous manufacturing process lies in the fact that the reconstructed wafer RWb is not singulated, and the redistribution structure 900 interconnects the several semiconductor packages or chips 700A-700Z. In some embodiments, the wafer-size semiconductor package 20 may include additional components than the ones illustrated in FIG. 5. For example, the wafer-size semiconductor package 20 may include additional die tiers and redistribution structures alternately stacked, TIVs, TSVs, interposers, and so on.

The semiconductor packages or chips 700A-700Z may be or include packaged semiconductor chips (as the semiconductor package 10 of FIG. 1G including the semiconductor chips 100, 110, 120, 130), as well as individual semiconductor chips. The semiconductor packages or chips 700A-700Z may each independently be or include memory chips, logic chips, and so on. The semiconductor packages or chips 700A-700Z included in the wafer-size semiconductor package 20 may each perform different functions, include different component, and have different shapes and aspect ratios. For example, the semiconductor packages or chips 700A-700Z illustrated in FIG. 5 may have rectangular shapes, possibly (but not necessarily) with aspect ratios differing from each other. In some embodiments, the aspect ratios of the semiconductor packages or chips 700A-700Z may be larger than 2. In some embodiments, the aspect ratios of the semiconductor packages or chips 700A-700Z may be larger than 3. In some embodiments, the semiconductor packages or chips 700A-700Z are disposed in the reconstructed wafer RWb oriented along different directions. For examples, the semiconductor packages or chips 700A, 700B, and 800D may be oriented along the Y direction, while the semiconductor package 700C may be oriented along the X direction. That is, the semiconductor packages or chips 700 may be disposed according to one of the patterns illustrated in FIG. 4A to FIG. 4F or variants thereof. Even though the wafer-size semiconductor package 20 is not singulated, and as such does not include scribe line regions (as illustrated, e.g., in FIG. 1F), if the semiconductor packages or chips 700A-700Z are all oriented along the same direction channels or regions including only the encapsulant 800 may be formed. Such channels or regions may increase the warpage of the reconstructed wafer RWb in a similar manner as previously described for the scribe line regions.

In some embodiments, by carefully disposing the semiconductor packages or chips 700A-700Z (e.g., according to the patterns of FIG. 4A to FIG. 4F or variants thereof) within the reconstructed wafer RWb, the numbers of the channels or regions of sole encapsulant 800 extending in the X direction or the Y direction may be reduced or balanced, possibly leading to reduced warpage of the reconstructed wafer RWb. As such, the manufacturing yield and the reliability of the wafer-size semiconductor package 20 may increase.

In accordance with some embodiments of the disclosure, a manufacturing method of a semiconductor package includes the following steps. Semiconductor chips are disposed on a carrier. The semiconductor chips are grouped in a plurality of package units. The semiconductor chips are encapsulated in an encapsulant to form a reconstructed wafer. A redistribution structure is formed on the encapsulant. The redistribution structure electrically connects the semiconductor chips within a same package unit of the plurality of package units. The individual package units of the plurality of package units are separated by cutting through the reconstructed wafer along scribe line regions. In the reconstructed wafer, the plurality of package units are arranged so as to balance the number of scribe line regions extending across opposite halves of the reconstructed wafer in a first direction with respect to the number of scribe line regions extending across opposite halves of the reconstructed wafer in a second direction perpendicular to the first direction.

In accordance with some embodiments of the disclosure, a manufacturing method of a semiconductor package includes the following steps. A reconstructed wafer including plural package units is formed. Each package units comprises at least one semiconductor chip and is separated by adjacent package units by scribe line regions. The individual package units are separated by cutting through the reconstructed wafer along the scribe line regions. A first portion of the package units is oriented along a first direction and a second portion of the package units is oriented along a second direction perpendicular to the first direction. The package units of the first portion and the package units of the second portion are disposed in the reconstructed wafer so that a ratio of the number of scribe line regions extending in the first direction from one half of the reconstructed wafer to the other half of the reconstructed wafer to the number of scribe line regions extending in the second direction from one half of the reconstructed wafer to the other half of the reconstructed wafer is in the range from 1:1 to 1:2.

In accordance with some embodiments of the disclosure, a wafer-size semiconductor package is provided. The wafer-size semiconductor package includes semiconductor packages or chips, an encapsulant and a redistribution structure. The encapsulant laterally wraps the semiconductor packages or chips. Channels of encapsulant separate the semiconductor packages or chips. The redistribution structure extends on the encapsulant and the semiconductor packages or chips and interconnects the semiconductor packages or chips. A first portion of the semiconductor packages or chips is oriented along a first direction and a second portion of the semiconductor packages or chips is oriented along a second direction perpendicular to the first direction. The semiconductor packages or chips are disposed in the wafer-size semiconductor package so that a ratio of the number of channels of encapsulant extending in the first direction from one half of the wafer-size semiconductor package to the other half of the wafer-size semiconductor package to the number of channels of encapsulant extending in the second direction from one half of the wafer-size semiconductor package to the other half of the wafer-size semiconductor package is in the range from 1:1 to 1:2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:
    disposing semiconductor chips on a carrier, wherein the semiconductor chips are grouped in a plurality of package units;
    encapsulating the semiconductor chips in an encapsulant to form a reconstructed wafer;
    forming a redistribution structure on the encapsulant, wherein the redistribution structure electrically connects the semiconductor chips within a same package unit of the plurality of package units; and
    cutting through the reconstructed wafer along scribe line regions to separate the individual package units of the plurality of package units,
    wherein, in the reconstructed wafer, the plurality of package units are arranged so as to balance the number of scribe line regions extending across opposite halves of the reconstructed wafer in a first direction with respect to the number of scribe line regions extending across opposite halves of the reconstructed wafer in a second direction perpendicular to the first direction, and the plurality of package units are disposed alternately oriented along the first direction and the second direction in intersecting columns and rows.

2. The manufacturing method of claim 1, wherein:
    a cell unit enclosed on sides by the scribe line regions is formed after the cutting,
    the cell unit comprises a first package unit and a second package unit,
    the first package unit comprises a longer edge elongated along the first direction and a shorter edge connected to the longer edge and extended along the second direction,
    the second package unit comprises a longer edge and a shorter edge connected to the longer edge, and the longer edge of the second package unit is adjacent to the shorter edge of the first package unit and elongated along the second direction.

3. The manufacturing method of claim 1, wherein a first package unit of the plurality of package units is oriented along the first direction, and a second and a third package unit of the plurality of package units adjacent to the first package unit are oriented along the second direction.

4. The manufacturing method of claim 3, wherein the first package unit, the second package unit and the third package unit are disposed along three sides of a quadrangular unit, and a fourth package unit oriented along the first direction is disposed on the fourth side of the quadrangular unit.

5. The manufacturing method of claim 3, wherein the second package unit and the third package unit are disposed side by side with respect to each other along the first direction, and are adjacent with respect to the first package unit along the second direction.

6. The manufacturing method of claim 1, wherein forming the redistribution structure comprises forming grooves on an outermost dielectric layer of the redistributions structure in correspondence of the scribe line regions.

7. The manufacturing method of claim 1, wherein:
    a first cell unit and a second cell unit enclosed on sides by the scribe line regions are formed after the cutting,
    the first cell unit comprises first package units that are disposed side by side and comprise longer edges elongated along the first direction, and
    the second cell unit adjacent to the first cell unit comprises second package units that are disposed side by side and comprise longer edges elongated along the second direction.

8. The manufacturing method of claim 1, wherein:
    a cell unit enclosed on sides by the scribe line regions is formed after the cutting,
    the cell unit comprises first package units and second package units adjacent to the first package units,
    the first package units are disposed side by side and comprise longer edges elongated along the first direction, and
    the second package units are disposed side by side and comprise longer edges elongated along the second direction.

9. A manufacturing method of a semiconductor package, comprising:
    forming a reconstructed wafer comprising plural package units, wherein each package unit comprises at least one semiconductor chip and is separated from adjacent package units by scribe line regions; and
    cutting through the reconstructed wafer along the scribe line regions to separate the individual package units,
    wherein a first portion of the package units is oriented along a first direction and a second portion of the package units is oriented along a second direction perpendicular to the first direction, and the package units of the first portion and the package units of the second portion are disposed in the reconstructed wafer so that a ratio of the number of scribe line regions extending in the first direction from one half of the reconstructed wafer to the other half of the reconstructed wafer to the number of scribe line regions extending in the second direction from one half of the reconstructed wafer to the other half of the reconstructed wafer is in the range from 1:1 to 1:2, and a line of the package units oriented along the first direction is disposed in between lines of package units oriented along the second direction.

10. The manufacturing method of claim 9, wherein the package units of the first portion and the second portion are arranged in lines, and the package units within each line are oriented along the same direction.

11. The manufacturing method of claim 9, wherein:
    in a top view, the first portion of the package units comprises a longer edge and a shorter edge connected to the longer edge, the longer edge of the first portion is elongated along the first direction, and the shorter edge of the first portion is extended along the second direction, and
    the second portion of the package units comprises a longer edge and a shorter edge connected to the longer edge, the longer edge of the second portion is elongated along the second direction, and the shorter edge of the second portion is extended along the first direction.

12. The manufacturing method of claim 9, wherein the scribe line regions extending along the first direction are unequally spaced from each other along the second direction.

13. The manufacturing method of claim 12, wherein cutting through the reconstructed wafer comprises a first cutting process in which the quadrants are separated, and a second cutting process in which the package units within each quadrant are separated.

14. The manufacturing method of claim 13, wherein a mechanical die saw is employed in the first cutting process and the second cutting process.

15. The manufacturing method of claim 9, wherein a footprint of each package unit is rectangular, with an aspect ratio of the longer edge to the shorter edge being greater than 2.

16. The manufacturing method of claim 9, wherein forming the package units comprises:
   placing semiconductor chips on a carrier; and
   encapsulating the semiconductor chips.

17. A manufacturing method of a semiconductor package, comprising:
   forming a reconstructed wafer comprising package units; and
   cutting through the reconstructed wafer along X-direction scribe lines and Y-direction scribe lines to separate the individual package units, wherein:
      the reconstructed wafer is divided in quadrants by a pair of central intersecting scribe lines passing a center of the reconstructed wafer, the package units are all oriented along a same direction within each of the quadrants, and the package units of adjacent two of the quadrants are oriented along different directions,
      each of the package units within a first quadrant comprises longer edges elongated along the Y-direction scribe lines and shorter edges extended along the X-direction scribe lines, and
      each of the package units within a second quadrant adjacent to the first quadrant comprises longer edges elongated along the X-direction scribe lines and shorter edges extended along the Y-direction scribe lines.

18. The manufacturing method of claim 17, wherein the package units within a third quadrant have a same arrangement as the package units within the first quadrant, and the second quadrant is between the first quadrant and the third quadrant.

19. The manufacturing method of claim 17, wherein:
   a first package unit within the first quadrant is closest to the center of the reconstructed wafer, relative to the rest of the package units within the first quadrant,
   a second package unit within the second quadrant is closest to the center of the reconstructed wafer, relative to the rest of the package units within the second quadrant,
   a third package unit within the third quadrant is closest to the center of the reconstructed wafer, relative to the rest of the package units within the third quadrant,
   a fourth package unit within the fourth quadrant is closest to the center of the reconstructed wafer, relative to the rest of the package units within the fourth quadrant, and
   one of the first, second, third, and fourth package units is oriented along a different direction than adjacent two of the first, second, third, and fourth package units.

20. The manufacturing method of claim 17, wherein the Y-direction scribe lines within the first quadrant are offset from the Y-direction scribe lines within the second quadrant.

* * * * *